(12) United States Patent
Choi

(10) Patent No.: US 12,032,794 B2
(45) Date of Patent: Jul. 9, 2024

(54) DISPLAY DEVICE

(71) Applicant: Samsung Display Co., Ltd., Yongin-si (KR)

(72) Inventor: Chul Hyun Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/967,674

(22) Filed: Oct. 17, 2022

(65) Prior Publication Data

US 2023/0132240 A1    Apr. 27, 2023

(30) Foreign Application Priority Data

Oct. 21, 2021   (KR) .......................... 10-2021-0140764

(51) Int. Cl.
| | | |
|---|---|---|
| *G06F 3/044* | (2006.01) | |
| *G06F 3/041* | (2006.01) | |
| *H10K 59/35* | (2023.01) | |
| *H10K 59/12* | (2023.01) | |
| *H10K 59/121* | (2023.01) | |

(52) U.S. Cl.
CPC .......... *G06F 3/0446* (2019.05); *G06F 3/0412* (2013.01); *H10K 59/35* (2023.02); *G06F 2203/04107* (2013.01); *H10K 59/12* (2023.02); *H10K 59/121* (2023.02)

(58) Field of Classification Search
CPC ................ G06F 3/0446; G06F 3/0412; G06F 2203/04107; H10K 59/35; H10K 59/12; H10K 59/121
See application file for complete search history.

(56) References Cited

U.S. PATENT DOCUMENTS

| | | |
|---|---|---|
| 9,477,352 B2 | 10/2016 | Cok |
| 9,853,092 B2 | 12/2017 | Lee et al. |
| 10,734,452 B1 | 8/2020 | Kim et al. |
| 10,957,745 B2 | 3/2021 | Hong et al. |
| 2016/0035795 A1 | 2/2016 | Lim et al. |
| 2018/0151539 A1* | 5/2018 | Nakamura ............. H10K 59/30 |
| 2019/0043927 A1* | 2/2019 | Jang .................... G09G 3/3233 |
| 2019/0369784 A1 | 12/2019 | Yao et al. |

FOREIGN PATENT DOCUMENTS

| | | |
|---|---|---|
| KR | 10-1919554 B1 | 11/2018 |
| KR | 10-2040647 B1 | 11/2019 |
| KR | 10-2020-0089379 A | 7/2020 |

* cited by examiner

*Primary Examiner* — Lisa S Landis
(74) *Attorney, Agent, or Firm* — Lewis Roca Rothgerber Christie LLP

(57) ABSTRACT

A display panel includes first, second, and third color light emitting areas and a non-light emitting area disposed among the first, second, and third color light emitting areas. First, second, and third openings corresponding to the first, second, and third color light emitting areas are defined in an input sensor. A sensing electrode includes a first line area and a second line area facing each other in a first direction around each of the first, second, and third openings and a third line area and a fourth line area facing each other in a second direction intersecting the first direction. A distance between the first color light emitting area and the first line area is less than a distance between the second and third color light emitting areas and the first line area.

20 Claims, 19 Drawing Sheets

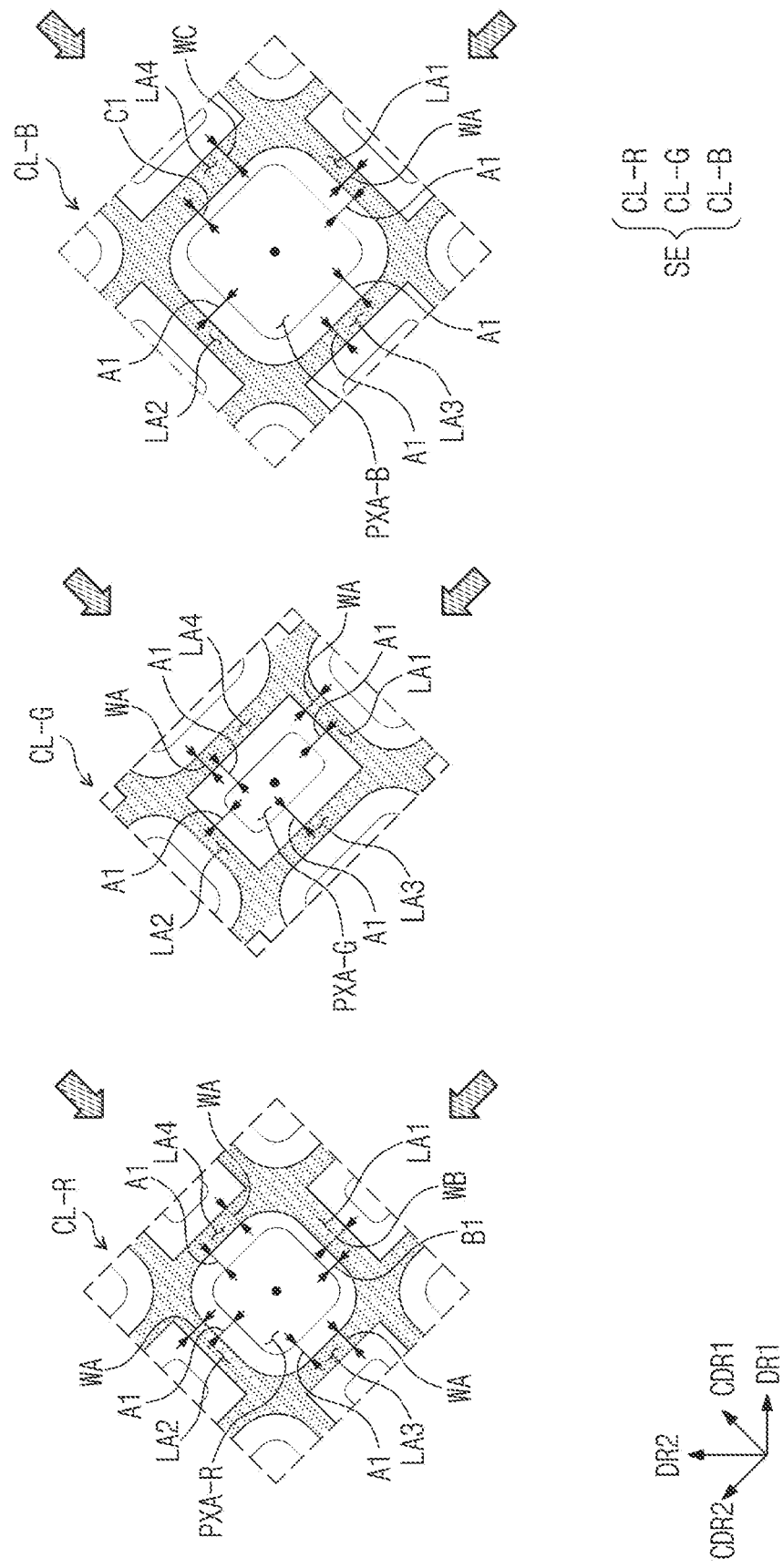

DISPLAY DEVICE

CROSS-REFERENCE TO RELATED APPLICATIONS

The present application claims priority to and the benefit of Korean Patent Application No. 10-2021-0140764 filed on Oct. 21, 2021, in the Korean Intellectual Property Office, the entire disclosures of which is incorporated herein by reference.

BACKGROUND

1. Field

Aspects of some embodiments of the present disclosure described herein relate to a display device including an input sensor.

2. Description of the Related Art

Electronic devices such as smartphones, tablets, laptop computers, navigation systems, and smart televisions have become a ubiquitous part of modern society. Electronic devices may include a display panel to display information to users. Electronic devices may further include various electronic modules other than the display panel.

Electronic devices may be designed to satisfy display quality conditions suitable for each purpose of use. Light generated from a light emitting element may be emitted to the outside of the electronic device while generating various optical phenomena such as a resonance phenomenon and an interference phenomenon. Such an optical phenomenon may affect the quality of the displayed image.

The above information disclosed in this Background section is only for enhancement of understanding of the background and therefore the information discussed in this Background section does not necessarily constitute prior art.

SUMMARY

Aspects of some embodiments of the present disclosure include a display device with relatively improved display quality.

According to some embodiments, a display device may include a display panel including first, second, and third color light emitting areas and a non-light emitting area located among the first, second, and third color light emitting areas and an input sensor including a sensing electrode, in which first, second, and third openings corresponding to the first, second, and third color light emitting areas are defined and overlapping the non-light emitting area. The input sensor is located on the display panel. The sensing electrode may include a first line area and a second line area facing each other in a first direction around each of the first, second, and third openings and a third line area and a fourth line area facing each other in a second direction intersecting the first direction. A distance between the first color light emitting area and the first line area may be less than a distance between the second color light emitting area and the first line area and the distance between the first color light emitting area and the first line area is less than a distance between the third color light emitting area and the first line area.

According to some embodiments, a distance between the first color light emitting area and the third line area and a distance between the first color light emitting area and the fourth line area may be the same as each other. A distance between the second color light emitting area and the third line area and a distance between the second color light emitting area and the fourth line area may be the same as each other. A distance between the third color light emitting area and the third line area and a distance between the third color light emitting area and the fourth line area may be the same as each other.

According to some embodiments, a distance between the first color light emitting area and the second line area, a distance between the second color light emitting area and the second line area, and a distance between the third color light emitting area and the second line area may be the same as one another.

According to some embodiments, the distance between the first color light emitting area and the first line area may be less than a distance between the first color light emitting area and the second line area. The distance between the second color light emitting area and the first line area and a distance between the second color light emitting area and the second line area may be the same as each other. The distance between the third color light emitting area and the first line area and a distance between the third color light emitting area and the second line area may be the same as each other.

According to some embodiments, the first line area and the second line area may extend in the second direction. A line width of the first line area adjacent to the first color light emitting area may be greater than a line width of the first line area adjacent to the second color light emitting area and the line width of the first line area adjacent to the first color light emitting area is greater than a line width of the first line area adjacent to the third color light emitting area.

According to some embodiments, the third line area and the fourth line area may extend in the first direction. The line width of the first line area adjacent to the first color light emitting area may be greater than a line width of the third line area adjacent to the first color light emitting area and the line width of the first line area adjacent to the first color light emitting area is greater than a line width of the fourth line area adjacent to the first color light emitting area.

According to some embodiments, each of the first, second, and third color light emitting areas may include a first edge and a second edge facing each other in the first direction and a third edge and a fourth edge facing each other in the second direction.

According to some embodiments, a spherical coordinate system may be defined in the display panel. A white image displayed on the display panel may be measured as a white image shifted to a first color at a first point of the spherical coordinate system. The first point may be more adjacent to the first line area than the second line area.

According to some embodiments, a distance between the first color light emitting area and the third line area may be less than a distance between the second color light emitting area and the third line area and the distance between the first color light emitting area and the third line area is less than a distance between the third color light emitting area and the third line area.

According to some embodiments, a distance between one of the second color light emitting area and the third color light emitting area and one of the second to fourth areas may be less than a distance between the other of the second color light emitting area and the third color light emitting area and the one of the second to fourth areas. The distance between the one of the second color light emitting area and the third color light emitting area and the one of the second to fourth areas may be less than a distance between the first color light emitting area and the one of the second to fourth areas.

According to some embodiments, the distance between the first color light emitting area and the first line area may be 15 to 20 micrometers.

According to some embodiments, the display device may further include an optical film on the input sensor. The optical film may include a polarizing film and a retarder film.

According to some embodiments, each of the first color light emitting area, the second color light emitting area, and the third color light emitting area may be provided in plural. The plurality of first color light emitting areas and the plurality of third color light emitting areas may define a first row. The plurality of second color light emitting areas may define a second row. The plurality of first color light emitting areas and the plurality of third color light emitting areas may be alternately arranged along a third direction intersecting the first direction and the second direction in the first row.

According to some embodiments, the display panel may further include a pixel definition layer in which first, second, and third color openings corresponding to the first, second, and third color light emitting areas are defined.

According to some embodiments, a thickness of the first line area adjacent to the first color light emitting area may be greater than a thickness of the first line area adjacent to the second color light emitting area and the thickness of the first line area adjacent to the first color light emitting area is greater than a thickness of the first line area adjacent to the third color light emitting area.

According to some embodiments, a display device may include a display panel including first, second, and third color light emitting areas and a non-light emitting area located among the first, second, and third color light emitting areas and an input sensor including a sensing electrode in which first, second, and third openings corresponding to the first, second, and third color light emitting areas are defined. The input sensor on the display panel. The sensing electrode may include a first conductive line overlapping the non-light emitting area and defining the first opening, a second conductive line defining the second opening, and a third conductive line defining the third opening. A distance between a first area of the first conductive line adjacent to a first point of a spherical coordinate system and the first color light emitting area may be less than a distance between a second area of the first conductive line adjacent to a second point of the spherical coordinate system and the first color light emitting area. A distance between a first area of the second conductive line adjacent to the first point and the second color light emitting area may be the same as a distance between a second area of the second conductive line adjacent to the second point and the second color light emitting area. A distance between a first area of the third conductive line adjacent to the first point and the third color light emitting area may be the same as a distance between a second area of the third conductive line adjacent to the second point and the third color light emitting area.

According to some embodiments, the first conductive line may further include a third area adjacent to a third point of the spherical coordinate system and a fourth area adjacent to a fourth point of the spherical coordinate system. The third area of the first conductive line and the fourth area of the first conductive line may be arranged between the first area of the first conductive line and the second area of the first conductive line. A distance between a third area of the first conductive line and the first color light emitting area may be the same as a distance between a fourth area of the first conductive line and the first color light emitting area.

According to some embodiments, the distance between the first area of the first conductive line and the first color light emitting area may be the same as a distance between the third area of the first conductive line and the first color light emitting area.

According to some embodiments, the first area of the first conductive line may have a wider line width than the second area of the first conductive line.

According to some embodiments, each of the first area of the first conductive line and the second area of the first conductive line may be parallel to a virtual line connecting the third point and the fourth point.

BRIEF DESCRIPTION OF THE DRAWINGS

The above and other characteristics and features of embodiments according to the present disclosure will become apparent by describing in more detail aspects of some embodiments thereof with reference to the accompanying drawings.

FIGS. 9A, 9B, and 9C are plan views illustrating an arrangement relationship between light emitting areas and a sensing electrode according to some embodiments of the present disclosure.

DETAILED DESCRIPTION

Figure 1:
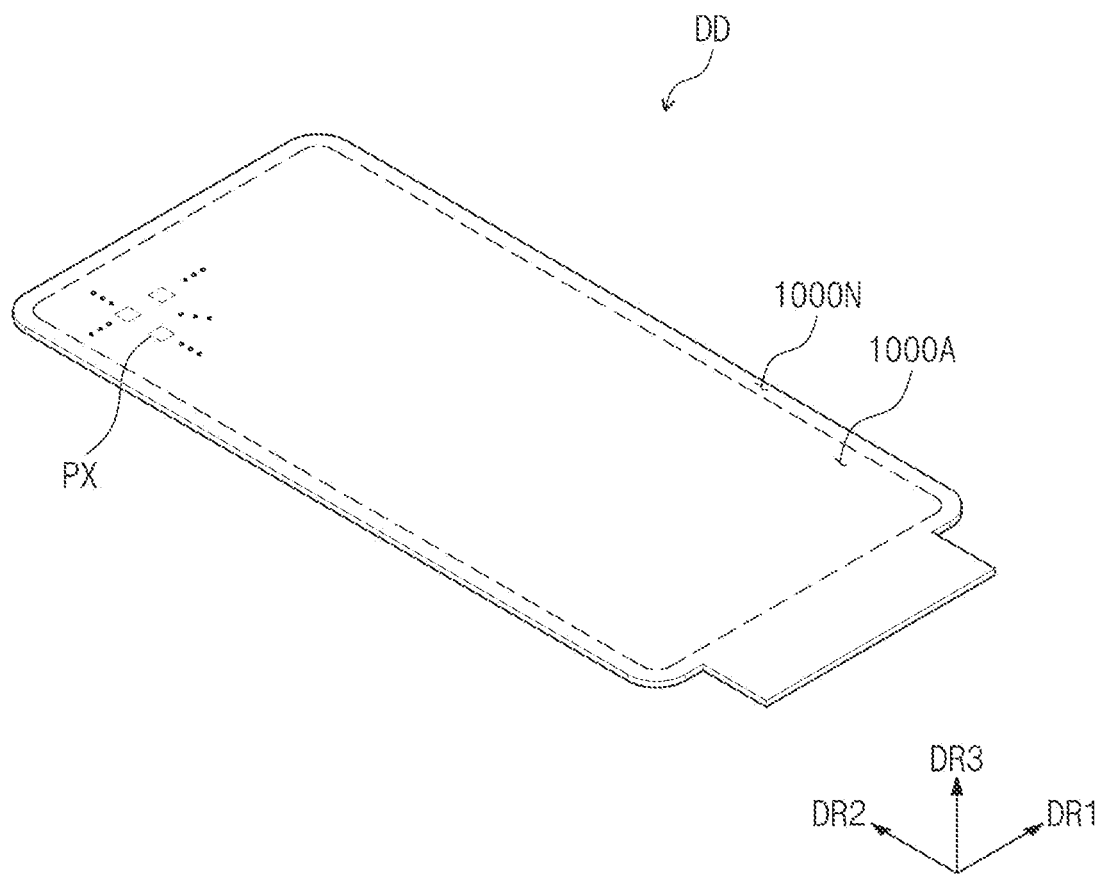
FIG. 1 is a perspective view of a display device according to some embodiments of the present disclosure.

In the specification, the expression that a first component (or region, layer, part, portion, etc.) is "on", "connected with", or "coupled with" a second component means that the first component is directly on, connected with, or coupled with the second component or means that a third component is interposed therebetween.

The same reference numerals refer to the same components. Also, in the drawings, the thicknesses, the ratios, and the dimensions of the elements may be exaggerated for effective description of technical contents. The expression "and/or" includes one or more combinations which associated components are capable of defining.

Although the terms "first," "second," etc. may be used herein in describing various elements, such elements should not be construed as being limited by these terms. These terms are only used to distinguish one element from another element. For example, a first element could be termed a second element without departing from the scope of the claims of the present disclosure, and similarly a second element could be termed a first element. The singular forms are intended to include the plural forms unless the context clearly indicates otherwise.

Also, the terms "under", "below", "on", "above", etc. are used to describe the correlation of components illustrated in drawings. These terms are relative concepts and are described on the basis of the directions shown in the drawings.

It will be further understood that the terms "comprises", "includes", "have", etc. specify the presence of stated features, numbers, steps, operations, elements, components, or a combination thereof but do not preclude the presence or addition of one or more other features, numbers, steps, operations, elements, components, or a combination thereof.

Unless otherwise defined, all terms (including technical terms and scientific terms) used in the specification have the same meaning as commonly understood by one skilled in the art to which the present disclosure belongs. In addition, terms such as terms defined in commonly used dictionaries should be interpreted as having a meaning consistent with the meaning in the context of the related technology, and should not be interpreted as an ideal or excessively formal meaning unless explicitly defined in the present disclosure.

Hereinafter, aspects of some embodiments of the present disclosure will be described in more detail with reference to the accompanying drawings.

FIG. 1 is a perspective view of a display device DD according to some embodiments of the present disclosure.

The display device DD may generate or display images and may detect an external input. The display device DD may include a display area 1000A and a peripheral area 1000N. A pixel PX may be located in the display area 1000A. The pixel PX may include a first color pixel, a second color pixel, and a third color pixel, each of which generates different color light.

Images may be displayed on the display area 1000A. The display area 1000A may include a plane defined by a first direction DR1 and a second direction DR2. The display area 1000A may further include curved surfaces respectively bent from at least two sides of the plane. However, the shape of the display area 1000A is not limited thereto. For example, the display area 1000A may more than two curved surfaces respectively bent from more than two sides of the plane, for example, four curved surfaces respectively bent from four sides of the plane.

Figure 2:
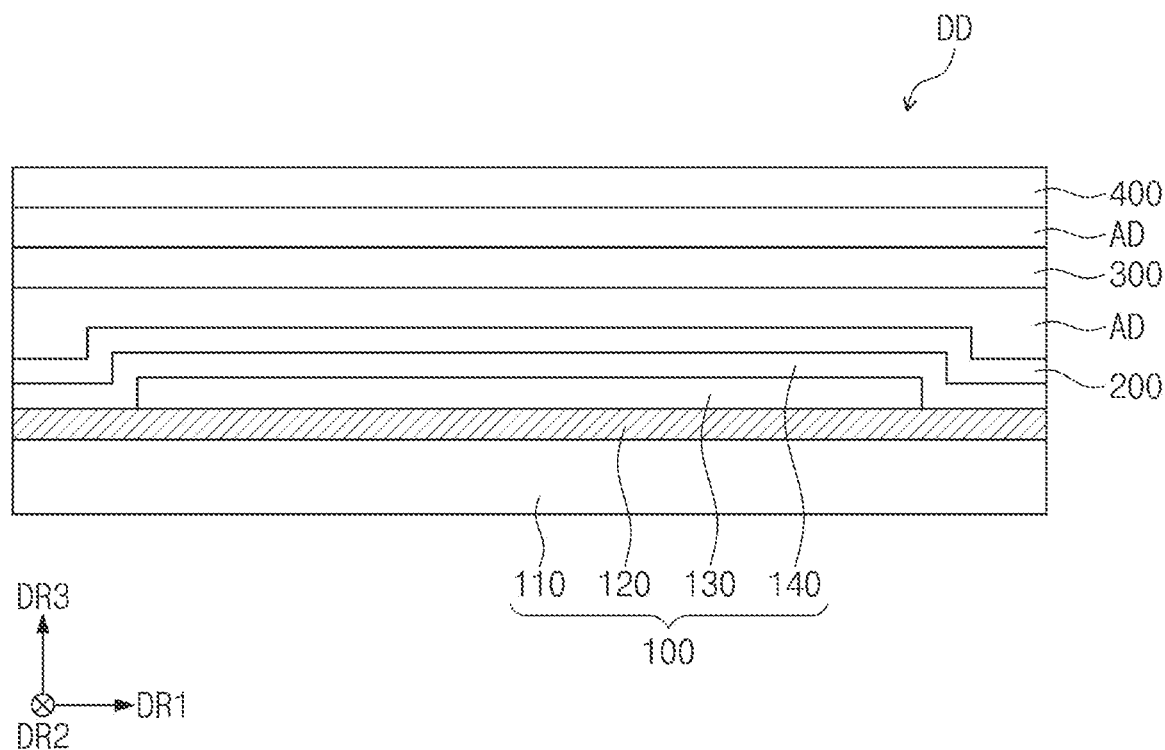
FIG. 2 is a cross-sectional view of a display device according to some embodiments of the present disclosure.

FIG. 2 is a cross-sectional view of a display device DD according to some embodiments of the present disclosure. Referring to FIG. 2, the display device DD may include a display panel 100, an input sensor 200, an anti-reflector 300, and a window 400.

The display panel 100 may be a light emitting display panel. For example, the display panel 100 may be an organic light emitting display panel, an inorganic light emitting display panel, a micro-LED display panel, or a nano-LED display panel. The display panel 100 may include a base layer 110, a circuit layer 120, a light emitting element layer 130, and an encapsulation layer 140.

The base layer 110 may provide a base surface on which the circuit layer 120 is located. The base layer 110 may be a rigid substrate or a flexible substrate facilitating bending, folding, or rolling. The base layer 110 may be a glass substrate, a metal substrate, a polymer substrate, or the like. However, embodiments of the present disclosure are not limited thereto, and the base layer 110 may include an inorganic layer, an organic layer, or a composite material layer.

The base layer 110 may have a multi-layered structure. For example, the base layer 110 may include a first synthetic resin layer, multi-layered or single-layered inorganic layer, or a second synthetic resin layer located on the multi-layered or single-layered inorganic layer. Each of the first and second synthetic resin layers may include, but is not particularly limited to, a polyimide-based resin.

The circuit layer 120 may be located on the base layer 110. The circuit layer 120 may include an insulating layer, a semiconductor pattern, a conductive pattern, a signal line, and the like. The circuit layer 120 may include a driving circuit of a pixel PX described with reference to FIG. 1.

The light emitting element layer 130 may be located on the circuit layer 120. The light emitting element layer 130 may include a light emitting element of the pixel PX described with reference to FIG. 1. For example, the light emitting element may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from moisture, oxygen, and foreign substances such as dust particles. The encapsulation layer 140 may include at least one inorganic layer. The encapsulation layer 140 may include a laminated structure of inorganic layer/organic layer/inorganic layer.

The input sensor 200 may be located on the display panel 100. The input sensor 200 may sense an external input applied from the outside. The external input may include various types of inputs such as a part of the user's body, light, heat, a pen, pressure, or the like.

The input sensor 200 may be formed on the display panel 100 through consecutive processes. At this time, the input sensor 200 may be directly located on the display panel 100. The expression that "component B is directly located on component A" may mean that a third component is not located between component A and component B. For example, an adhesive layer may not be located between the input sensor 200 and the display panel 100.

The anti-reflector 300 may be located on the input sensor 200. The anti-reflector 300 and the input sensor 200 may be coupled to each other by an adhesive layer AD. The anti-reflector 300 may reduce a reflectivity of external light.

The anti-reflector 300 may include an optical film. The optical film may include a polarizing film. The optical film may include a retarder film. The retarder film may include at least any one or more of a λ/2 retarder film and a λ/4 retarder film.

The window 400 may be located on the anti-reflector 300. The window 400 and the anti-reflector 300 may be coupled to each other by the adhesive layer AD. The adhesive layer AD may be a pressure sensitive adhesive (PSA) film or an optically clear adhesive (OCA) film.

The window 400 may include at least one base layer. The base layer may be a glass substrate or a synthetic resin film. The window 400 may have a multi-layered structure. The window 400 may include a thin film glass substrate and a synthetic resin film located on the thin film glass substrate. The thin film glass substrate and the synthetic resin film may be coupled to each other by an adhesive layer, and the adhesive layer and the synthetic resin film may be separated from the thin film glass substrate for replacement thereof.

According to some embodiments of the present disclosure, the adhesive layer AD may be omitted, and the window 400 may be directly located on the anti-reflector 300. An organic material, an inorganic material, or a ceramic material may be coated on the anti-reflector 300.

According to some embodiments, the anti-reflector 300 may be directly located on the input sensor 200 through consecutive processes.

The anti-reflector 300 may include a light shielding pattern overlapping a reflective structure located at a lower side of the anti-reflector 300. The anti-reflector 300 may further include a color filter overlapping a light emitting area which will be described below. The color filter may include a first color filter, a second color filter, and a third color filter respectively corresponding to the first color pixel, the second color pixel, and the third color pixel. The anti-reflector 300 will be described in detail below.

Figure 3A:
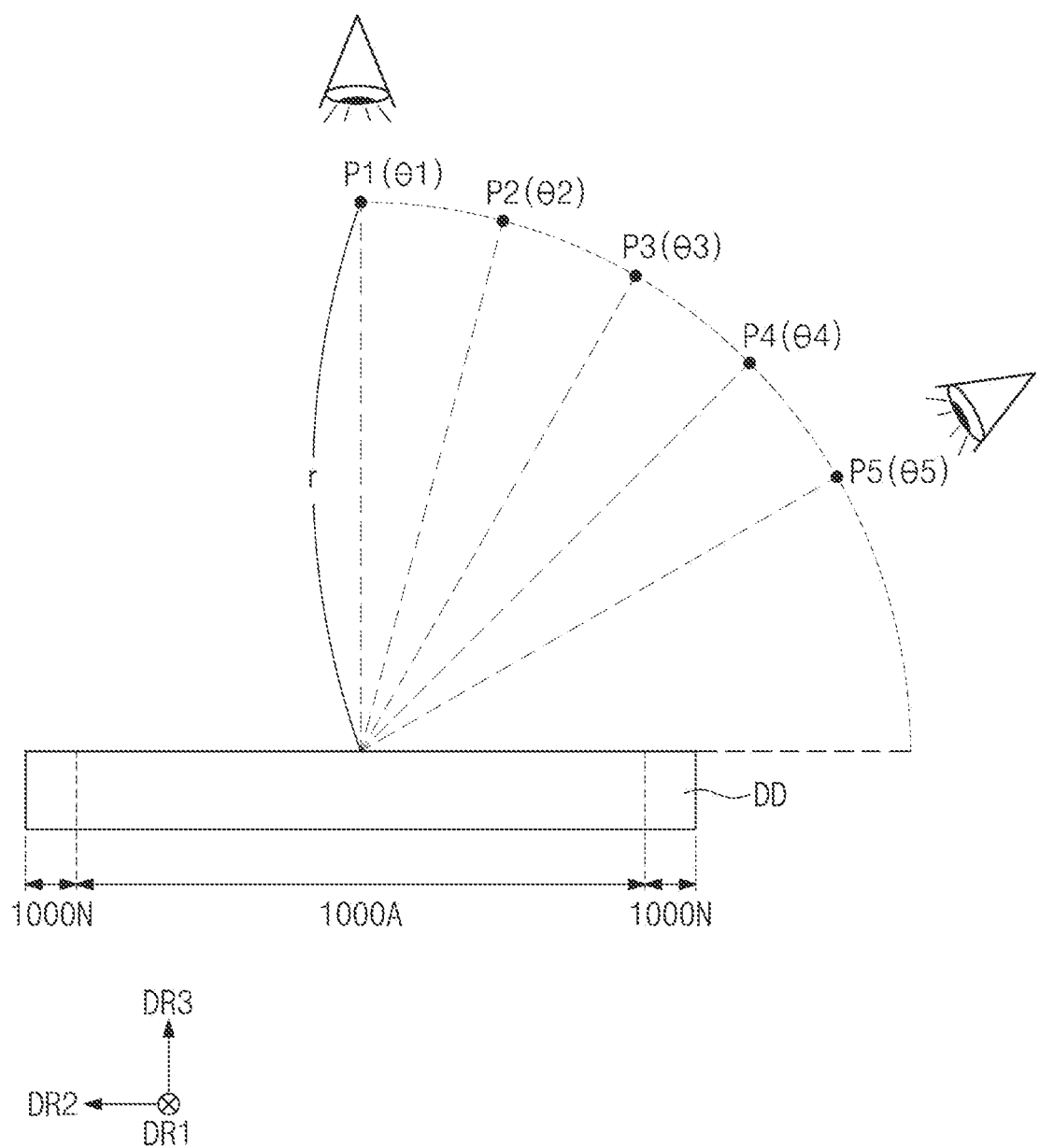
FIGS. 3A and 3B are drawings illustrating a spherical coordinate system defined in a display device according to some embodiments of the present disclosure.
Figure 3B:
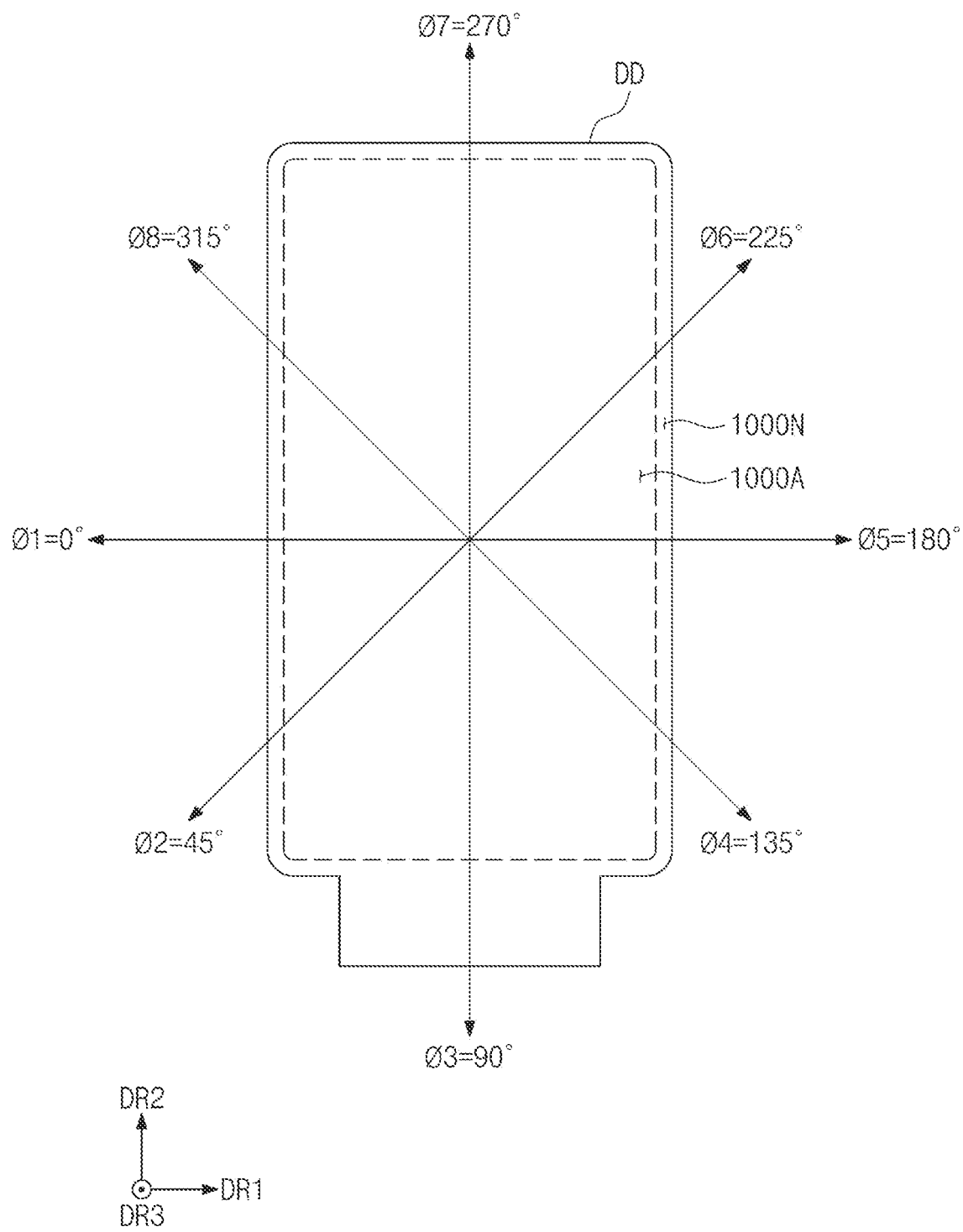
Figure 4:
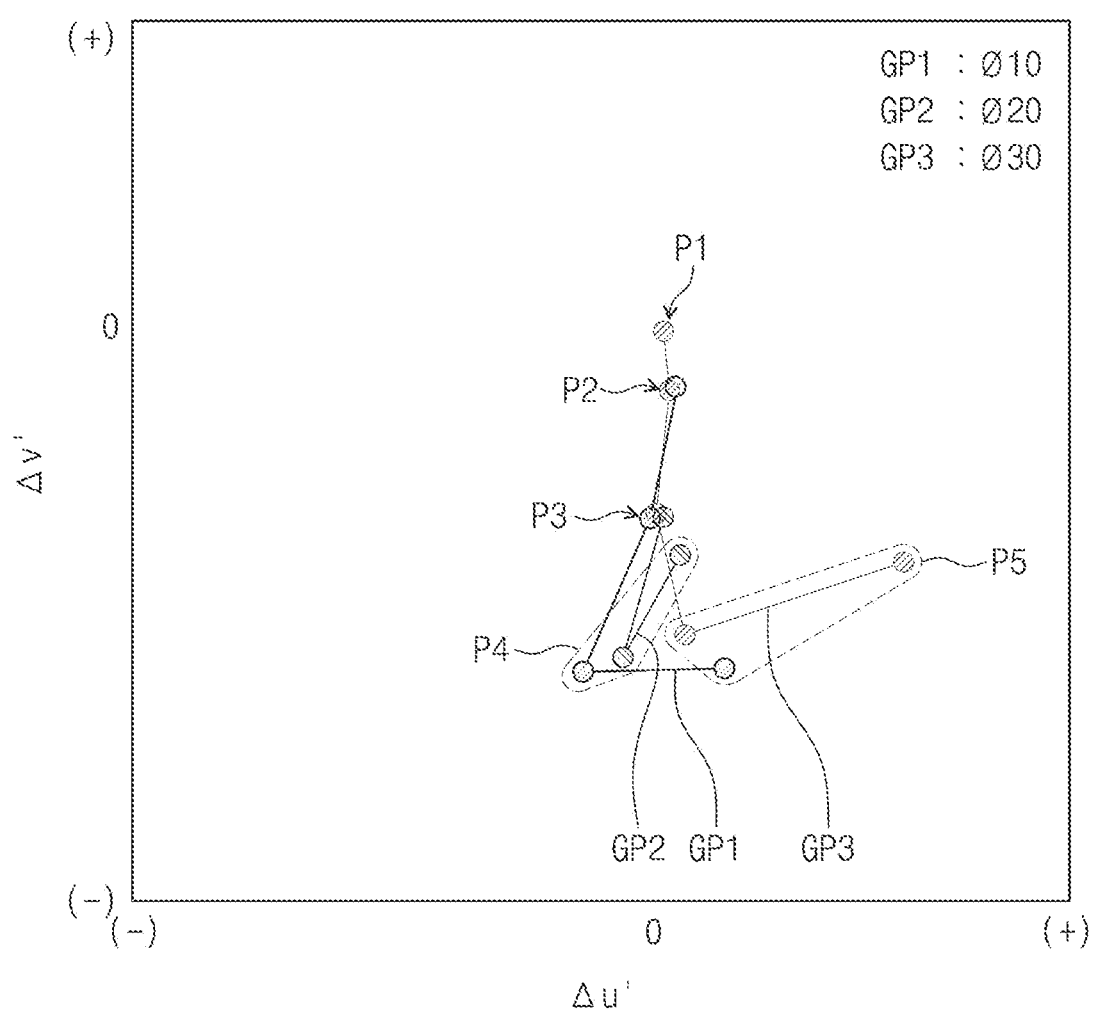
FIG. 4 is a graph illustrating the amount of change in color coordinates of a white image generated according to measurement points according to some embodiments of the present disclosure.

FIGS. 3A and 3B are drawings illustrating a spherical coordinate system defined in a display device DD. FIG. 4 is a graph illustrating the amount of change in color coordinates of a white image generated according to measurement points.

As shown in FIGS. 3A and 3B, the spherical coordinate system may be defined in the display device DD. The origin of the spherical coordinate system may be aligned with the center of a display area 1000A. The spherical coordinate system may be used to distinguish points for measuring display quality of the display device DD, and the points may be displayed as coordinates of the spherical coordinate system.

The coordinates of the spherical coordinate system are represented as (r, θ, φ). "r" denotes the distance from the origin to the measurement point, θ denotes the angle formed by a z-axis (or a normal axis of the display device DD) and the straight line defined between the origin and the measurement point, and φ denotes the angle formed by the straight line in which a straight line defined between the origin and the measurement point is reflected in an xy plane (or the front surface of the display device DD) with respect to an x-axis (or the horizontal axis passing through the center of the display device DD). For convenience of description, θ is defined as a viewing angle and φ is defined as an azimuth angle. For example, x-axis and y-axis may be in the first direction DR1 and the second direction DR2, respectively, and z-axis may be in the third direction DR3 which is perpendicular to the plane defined by the first direction DR1 and the second direction DR2.

FIG. 3A illustrates five measurement points P1 to P5. First to fifth viewing angles θ1, θ2, θ3, θ4, and θ5 may be spaced apart from each other by a certain angle to be measured. The first to fifth viewing angles θ1, θ2, θ3, θ4, and θ5 of the first to fifth measurement points P1 to P5 may be 0°, 15°, 30°, 45°, and 60°, respectively. Alternatively, the first to fifth viewing angles θ1, θ2, θ3, θ4, and θ5 of the first to fifth measurement points P1 to P5 may be 0°, 20°, 40°, 60°, and 80°, respectively. Alternatively, the first to fifth viewing angles θ1, θ2, θ3, θ4, and θ5 of the first to fifth measurement points P1 to P5 may be 0°, 10°, 20°, 30°, and 40°, respectively. Eighth azimuth angles φ1 to φ8 are illustrated as an example in FIG. 3B. The eighth azimuth angles φ1 to φ8 are 0°, 45°, 90°, 135°, 180°, 225°, 270°, 315°.

FIG. 4 illustrates first, second, and third graphs GP1, GP2, and GP3. Each of the first, second, and third graphs GP1, GP2, and GP3 includes the amounts Δu' and Δv' of change in color coordinates of a white image measured at the five measurement points P1 to P5. The five measurement points P1 to P5 are measured in the same distance r. Color coordinates (u', v') of the CIE 1976 color coordinate system of a white image measured at a point of (r, 0°, 0°) is a reference value.

The five measurement points P1 to P5 of the first graph GP1 have a first azimuth angle φ0 and have different viewing angles θ. As going from the first point to the fifth point, the viewing angle θ uniformly increases. The second graph GP2 and the third graph GP3 have a second azimuth angle φ20 and a third azimuth angle φ30, different from the first azimuth angle φ10 of the first graph GP1, respectively. The first azimuth angle φ10 may be smallest, the second azimuth angle φ20 may be greater than the first azimuth angle φ10 by 45°, and the third azimuth angle φ30 may be greater than the second azimuth angle φ20 by 45°.

It may be seen that the amounts Δu' and Δv' of change in color coordinates at the fifth measurement point P5 of the third graph GP3 is relatively large. In other words, a white image is recognized as a reddish white image by a user who looks at the white image at a point of the third azimuth angle φ30 and the fifth viewing angle θ5. As such, a phenomenon in which the amounts Δu' and Δv' of change in color coordinates are large at only a specific point is referred to as white angular dependency (WAD).

A white image generated by a display panel 100 shown in FIG. 2 is substantially a result of mixing first color light generated by a first color pixel, second color light generated by a second color pixel, and third color light generated by a third color pixel.

An interference phenomenon may occur in a process of passing through a structure located at an upper side of the pixel in the first color light, the second color light, and the third color light. Because of moving to another optical path depending on a viewing angle θ, an interference phenomenon may differently occur depending on the viewing angle θ and the amounts Δu' and Δv' of change in color coordinates may vary with the viewing angle θ. Because an interference degree of each of the first color light, the second color light, and the third color light differently occurs depending on an optical path, the white image may be shifted to a certain color.

Because of a structural characteristic of the display device DD, for example, arrangement of optical axes of the optical film, the amounts Δu' and Δv' of change in color coordinates may be larger at only a measurement point having a specific azimuth angle φ.

The white image may be recognized as a reddish white image, a bluish white image, or a greenish white image according to the direction of a change in color coordinates. Furthermore, the white image may be recognized as a reddish white image, a bluish white image, or a greenish white image according to an azimuth angle ϕ.

Hereinafter, a description will be given in detail of a principle of reducing white angular dependency (WAD) in the present disclosure.

Figure 5A:
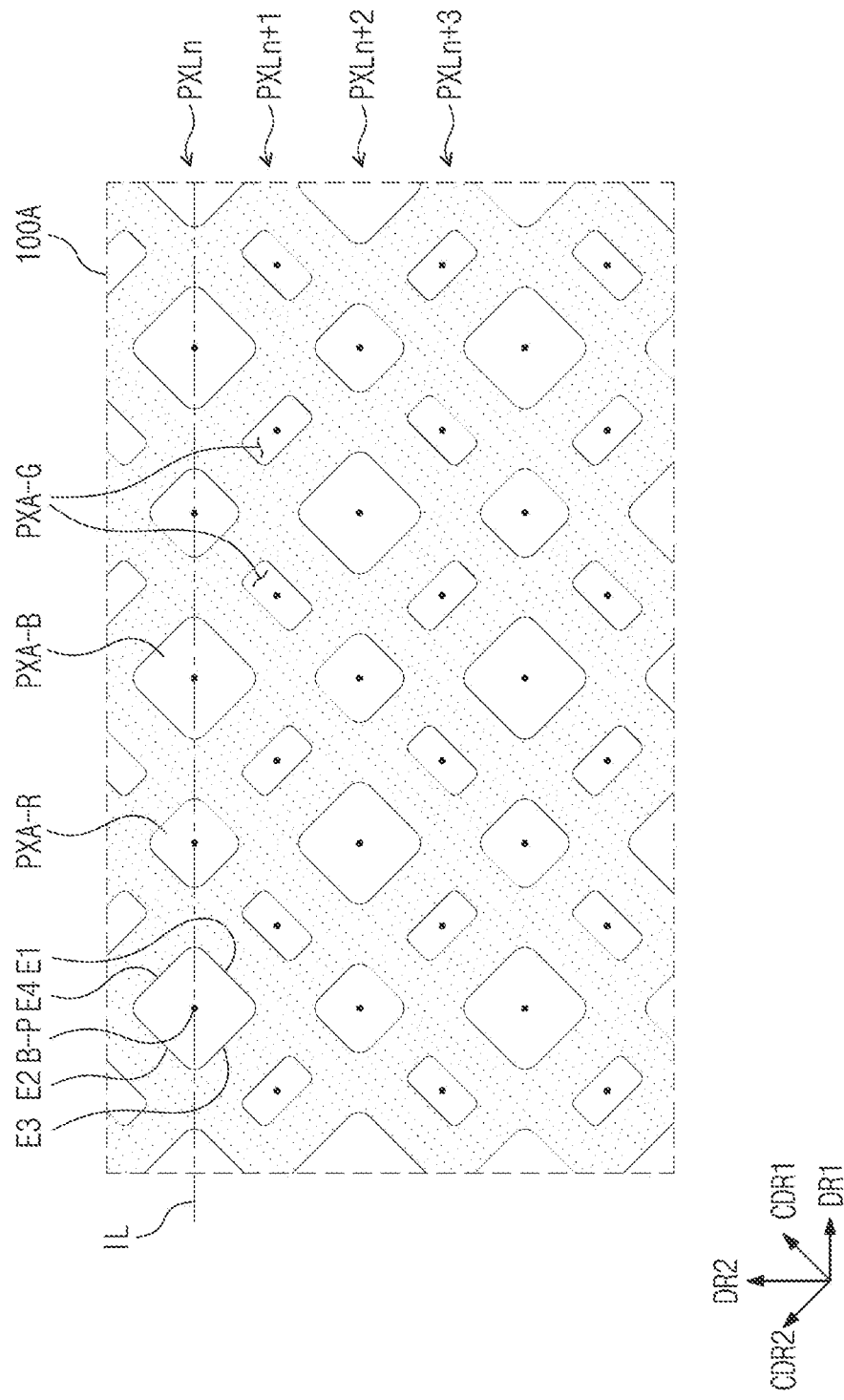
FIG. 5A is an enlarged plan view of a display area of a display panel according to some embodiments of the present disclosure.
Figure 5B:
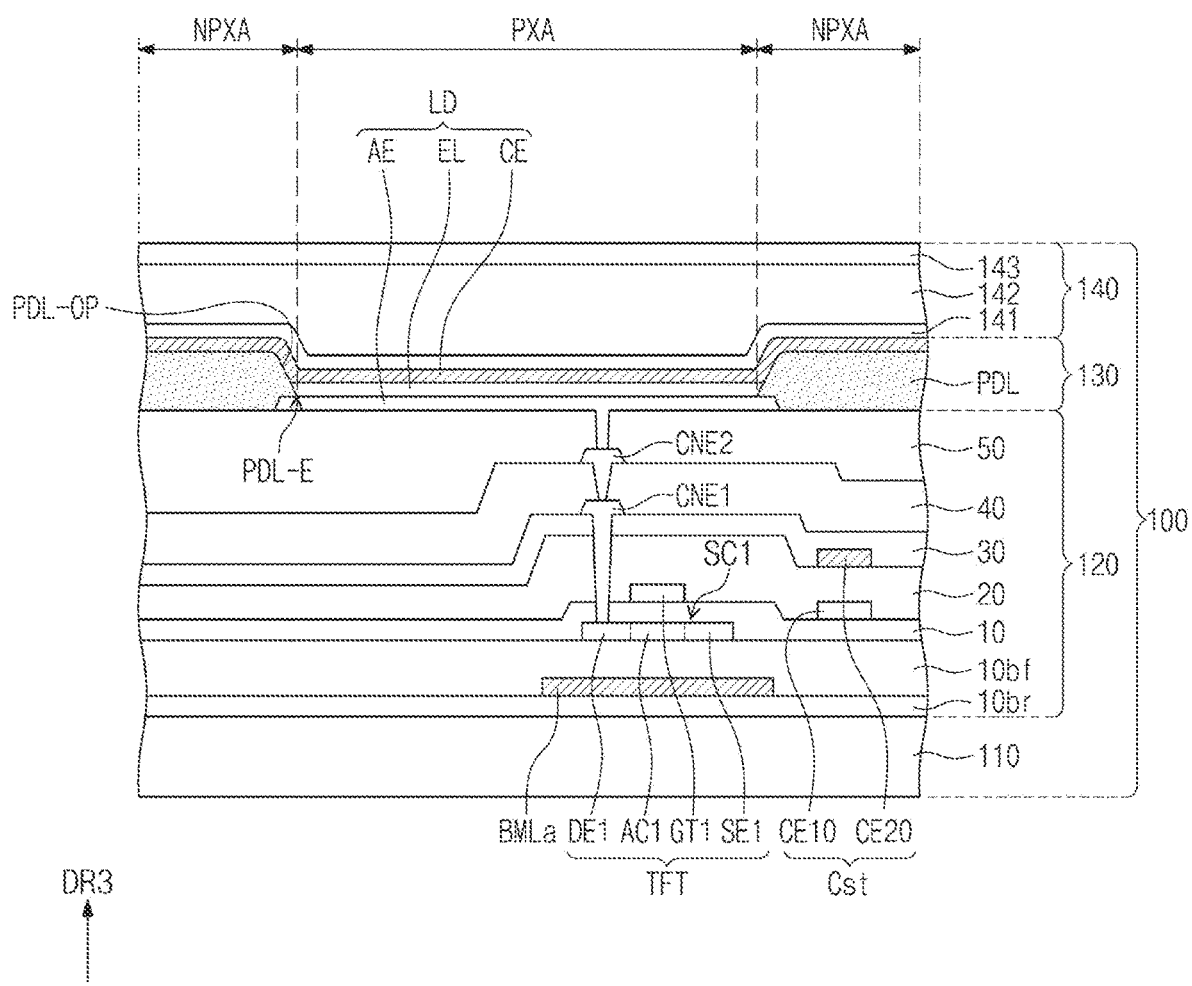
FIG. 5B is a cross-sectional view of a display area of a display panel according to some embodiments of the present disclosure.

FIG. 5A is an enlarged plan view of a display area 100A of a display panel 100 (refer to FIG. 2) according to some embodiments of the present disclosure. FIG. 5B is a cross-sectional view of a portion of a display area 100A of a display panel 100 (refer to FIG. 5B) according to some embodiments of the present disclosure.

Referring to FIG. 5A, the display area 100A may include a plurality of light emitting areas PXA-R, PXA-G, and PXA-B and a non-light emitting area NPXA (refer to FIG. 5A) arranged among the plurality of light emitting areas PXA-R, PXA-G, and PXA-B.

The plurality of light emitting areas PXA-R, PXA-G, and PXA-B may be divided into three groups of light emitting areas PXA-B, PXA-R, and PXA-G. The three groups of light emitting areas PXA-B, PXA-R, and PXA-G may be divided according to a color of source light generated by a light emitting element LD (refer to FIG. 5B).

The first color light emitting area PXA-R, the second color light emitting area PXA-G, and the third color light emitting area PXA-B may differ in area from each other. Herein, the present disclosure is not limited thereto. The first color light emitting area PXA-R, the second color light emitting area PXA-G, and the third color light emitting area PXA-B may be the same in area as each other. According to some embodiments, the first color may be red, the second color may be green, and the third color may be blue. According to some embodiments of the present disclosure, the display panel 100 may include three groups of light emitting areas displaying three main colors such as yellow, magenta, and cyan.

Each of the first color light emitting area PXA-R, the second color light emitting area PXA-G, and the third color light emitting area PXA-B may have a "substantial polygonal shape". Herein, the "substantial polygonal shape" includes a polygon in mathematical meaning and a polygon with curves defined at their vertices. The shape of a light emitting area may be the same as the shape of an opening formed in a pixel definition layer, and the shape of the vertex may vary with etching performance of the pixel definition layer.

According to some embodiments, the square-shaped first color light emitting area PXA-R, the square-shaped third color light emitting area PXA-B, and the rectangular second color light emitting area PXA-G are illustrated according to some embodiments of the present disclosure. The second color light emitting area PXA-G may include two types of second color light emitting areas, each of which has a different extension direction of the long edge.

Each of the first color light emitting area PXA-R, the second color light emitting area PXA-G, and the third color light emitting area PXA-B may include first to fourth edges E1 to E4. The first edge E1 and the second edge E2 may extend in a first oblique direction CDR1 intersecting a first direction DR1 and a second direction DR2 and may be spaced apart from each other across a corresponding light emitting area. The third edge E3 and the fourth edge E4 may extend in a second oblique direction CDR2 intersecting the first direction DR1, the second direction DR2, and the first oblique direction CDR1 and may be spaced apart from each other across a corresponding light emitting area.

Referring to FIG. 5A, the plurality of light emitting areas PXA-B, PXA-R, and PXA-G may define a plurality of light emitting rows listed along the second direction DR2. The light emitting rows may include an nth (where n is a natural number) light emitting row PXLn, an n+1st light emitting row PXLn+1, an n+2nd light emitting row PXLn+2, and an n+3rd light emitting row PXLn+3. The four light emitting rows PXLn, PXLn+1, PXLn+2, and PXLn+3 may form a group and may be repeatedly arranged along the second direction DR2. Each of the four light emitting rows PXLn, PXLn+1, PXLn+2, and PXLn+3 may extend along the first direction DR1.

The nth light emitting row PXLn may include first color light emitting area PXA-R and third color light emitting areas PXA-B, which are alternately arranged along the first direction DR1. The n+2nd light emitting row PXLn+2 may include third color light emitting areas PXA-B and first color light emitting areas PXA-R, which are alternately arranged along the first direction DR1.

An order where the light emitting areas of the nth light emitting row PXLn and an order where the light emitting areas of the n+2nd light emitting row PXLn+2 may differ from each other. The third color light emitting areas PXA-B and the first color light emitting areas PXA-R of the nth light emitting row PXLn may be alternately arranged with the third color light emitting areas PXA-B and the first color light emitting areas PXA-R of the n+2nd light emitting row PXLn+2. The light emitting areas of the n-th light emitting row PXLn are arranged as just like being shifted by one light emitting area along the first direction DR1 with respect to the light emitting areas of the n+2nd light emitting row PXLn+2.

The second color light emitting areas PXA-G may be arranged in each of the n+1st light emitting row PXLn+1 and the n+3rd light emitting row PXLn+3. The light emitting areas of the nth light emitting row PXLn and the light emitting areas of the n+1st light emitting row PXLn+1 may be alternately arranged. The light emitting areas of the n+2th light emitting row PXLn+2 and the light emitting areas of the n+3rd light emitting row PXLn+3 may be alternately arranged.

Center points B-P of light emitting areas arranged in each of the four light emitting rows PXLn, PXLn+1, PXLn+2, and PXLn+3 may be arranged on the same virtual line IL.

The cross section of the display panel 100 corresponding to one light emitting area PXA and a peripheral non-light emitting area NPXA is illustrated in FIG. 5B. A light emitting element LD and a transistor TFT connected with the light emitting element LD are illustrated in FIG. 5B. The transistor TFT may be one of a plurality of transistors included in a driving circuit of a pixel PX (refer to FIG. 1). According to some embodiments, the transistor TFT is described as a silicon transistor, but may be a metal oxide transistor.

A barrier layer 10br may be located on a base layer 110. The barrier layer 10br may prevent or reduce instances of foreign substances being introduced from the outside. The barrier layer 10br may include at least one inorganic layer. The barrier layer 10br may include a silicon oxide layer and a silicon nitride layer. Each of the silicon oxide layer and the silicon nitride layer may be provided in plural. The silicon oxide layers and the silicon nitride layers may be alternately laminated.

A shielding electrode BMLa may be located on the barrier layer 10br. The shielding electrode BMLa may include metal. The shielding electrode BMLa may include molybdenum (Mo) with good heat resistance, an alloy containing molybdenum (Mo), titanium (Ti), or an alloy containing titanium (Ti). The shielding electrode BMLa may receive a bias voltage.

The shielding electrode BMLa may block an electrical potential due to polarization from affecting the silicon transistor (S-TFT). The shielding electrode BMLa may block external light from reaching the silicon transistor (S-TFT). According to some embodiments of the present disclosure, the shielding electrode BMLa may be a floating electrode isolated from another electrode or a line.

A buffer layer 10bf may be located on the barrier layer 10br. The buffer layer 10bf may prevent or reduce instances of a phenomenon in which metal atoms or impurities are spread from the base layer 110 to an upper semiconductor pattern SC1. The buffer layer 10bf may include at least one inorganic layer. The buffer layer 10bf may include a silicon oxide layer and a silicon nitride layer.

The semiconductor pattern SC1 may be located on the buffer layer 10bf. The semiconductor pattern SC1 may include a silicon semiconductor. For example, the silicon semiconductor may include amorphous silicon, polycrystalline silicon, or the like. For example, the semiconductor pattern SC1 may include low-temperature polysilicon.

The semiconductor pattern SC1 may include a first area having high conductivity and a second area having low conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped with a concentration lower than the first area.

A conductivity of the first area is greater than a conductivity of the second area. The first area may substantially serves as an electrode or a signal line. The second area may substantially correspond to an active area (or channel) of the transistor. In other words, a portion of the semiconductor pattern SC1 may be an active area of the transistor, another portion thereof may be a source or a drain of the transistor, and the other may be a connection electrode or a connection signal line.

A source area SE1 (or a source), an active area AC1 (or a channel), and a drain area DE1 (or a drain) of the transistor TFT may be formed from the semiconductor pattern SC1. The source area SE1 and the drain area DE1 may extend in directions opposite to each other from the active area AC1 on the cross section.

A first insulating layer 10 may be located on the buffer layer 10bf. The first insulating layer 10 may overlap a plurality of pixels PX (refer to FIG. 1) in common and may cover the semiconductor pattern SC1. The first insulating layer 10 may be an inorganic layer and/or an organic layer and may have a single- or multi-layered structure. The inorganic layer may include at least one of aluminum oxide, titanium oxide, silicon oxide, silicon nitride, silicon oxynitride, zirconium oxide, or hafnium oxide. According to some embodiments, the first insulating layer 10 may be a single silicon oxide layer. As well as the first insulating layer 10, an insulating layer of a circuit layer 120 to be described below may be an inorganic layer and/or an organic layer and may have a single- or multi-layered structure. The inorganic layer may include, but is not limited to, at least one of the materials described above.

A gate GT1 of the transistor TFT may be located on the first insulating layer 10. The gate GT1 may be a portion of a metal pattern. The gate GT1 overlaps the active area AC1. The gate GT1 may function as a mask in a process of doping the semiconductor pattern SC1. The gate GT1 may include, but is not particularly limited to, titanium (Ti), silver (Ag), an alloy containing silver (Ag), molybdenum (Mo), an alloy containing molybdenum (Mo), aluminum (Al), an alloy containing aluminum (Al), an aluminum nitride (AlN), tungsten (W), a tungsten nitride (WN), copper (Cu), indium tin oxide (ITO), indium zinc oxide (IZO), or the like.

A second insulating layer 20 may be located on the first insulating layer 10 and may cover the gate GT1. A third insulating layer 30 may be located on the second insulating layer 20. A second electrode CE20 of a storage capacitor Cst may be located between the second insulating layer 20 and the third insulating layer 30. Furthermore, a first electrode CE10 of the storage capacitor Cst may be located between the first insulating layer 10 and the second insulating layer 20.

A first connection electrode CNE1 may be located on the third insulating layer 30. The first connection electrode CNE1 may be connected with the drain area DE1 of the transistor TFT through a contact hole penetrating the first to third insulating layers 10, 20, and 30.

A fourth insulating layer 40 may be located on the third insulating layer 30. A second connection electrode CNE2 may be located on the fourth insulating layer 40. The second connection electrode CNE2 may be connected with the first connection electrode CNE1 through a contact hole penetrating the fourth insulating layer 40. A fifth insulating layer 50 may be located on the fourth insulating layer 40 and may cover the second connection electrode CNE2. The structure where the first to fifth insulating layers 10 to 50 are laminated is merely illustrative. An additional conductive layer and an additional insulating layer may be further arranged other than the first to fifth insulating layers 10 to 50.

Each of the fourth insulating layer 40 and the fifth insulating layer 50 may be an organic layer. For example, the organic layer may include a general purpose polymer, such as Benzocyclobutene (BCB), polyimide, hexamethyldisiloxane (HMDSO), polymethylmethacrylate (PMMA), or polystyrene (PS), a polymer derivative with a phenol-based group, an acrylic-based polymer, an imide-based polymer, an aryl ether-based polymer, an amide-based polymer, a fluorine-based polymer, a p-xylene-based polymer, a vinyl alcohol-based polymer, a blend thereof, and the like.

The light emitting element LD may include a first electrode AE (or a pixel electrode), a light emitting layer EL, and a second electrode CE (or a common electrode). The first electrode AE may be located on the fifth insulating layer 50. The first electrode AE may be a (semi)transmissive electrode or a reflective electrode. The first electrode AE may include a reflective layer formed of Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may have at least one of indium tin oxide (ITO), indium zinc oxide (IZO), an indium gallium zinc oxide (IGZO), zinc oxide (ZnO), or indium oxide ($In_2O_3$), and zinc oxide (AZO) doped with aluminum (AZO). For example, the first electrode AE may include a laminated structure of ITO/Ag/ITO.

A pixel definition layer PDL may be located on the fifth insulating layer 50. According to some embodiments, the pixel definition layer PDL may have the property of absorbing light. For example, the pixel definition layer PDL may have a black color. The pixel definition layer PDL may include a black coloring agent. The black coloring agent may include black dye or black pigment. The black coloring agent may include carbon black, metal, such as chromium, or an oxide thereof. The pixel definition layer PDL may correspond to a light shielding pattern having a light shielding characteristic.

The pixel definition layer PDL may cover a portion of the first electrode AE. For example, an opening PDL-OP for exposing a portion of the first electrode AE may be defined in the pixel defining layer PDL. The opening PDL-OP of the pixel definition layer PDL may define a light emitting area PXA. According to some embodiments, a first color opening, a second color opening, and a third color opening corresponding to a first color light emitting area PXA-R (refer to FIG. 5A), a second color light emitting area PXA-G (refer to FIG. 5A), and a third color light emitting area PXA-B (refer to FIG. 5A) may be defined in the pixel definition layer PDL. When the pixel definition layer PDL is not located, the light emitting area PXA may be defined to be the same as the first electrode AE.

The pixel definition layer PDL may increase a distance between an edge of the first electrode AE and the second electrode CE. Thus, it may serve to prevent or reduce instances of an arc occurring at the edge of the first electrode AE by the pixel definition layer PDL.

According to some embodiments, a hole control layer may be located between the first electrode AE and the light emitting layer EL. The hole control layer may include a hole transport layer and may further include a hole injection layer. An electron control layer may be located between the light emitting layer EL and the second electrode CE. The electron control layer may include an electron transport layer and may further include an electron injection layer.

An encapsulation layer 140 may be located on the light emitting element layer 130. The encapsulation layer 140 may include an inorganic layer 141, an organic layer 142, and an inorganic layer 143 sequentially laminated on each other, but layers making up the encapsulation layer 140 are not limited thereto.

The inorganic layer 141 and the inorganic layer 143 may protect the light emitting element layer 130 from moisture and oxygen, and the organic layer 142 may protect the light emitting element layer 130 from foreign substances such as dust particles. The inorganic layer 141 and the inorganic layer 143 may include a silicon nitride layer, a silicon oxynitride layer, a silicon oxide layer, a titanium oxide layer, an aluminum oxide layer, or the like. The organic layer 142 may include, but is not limited to, an acryl-based organic layer.

Figure 6A:
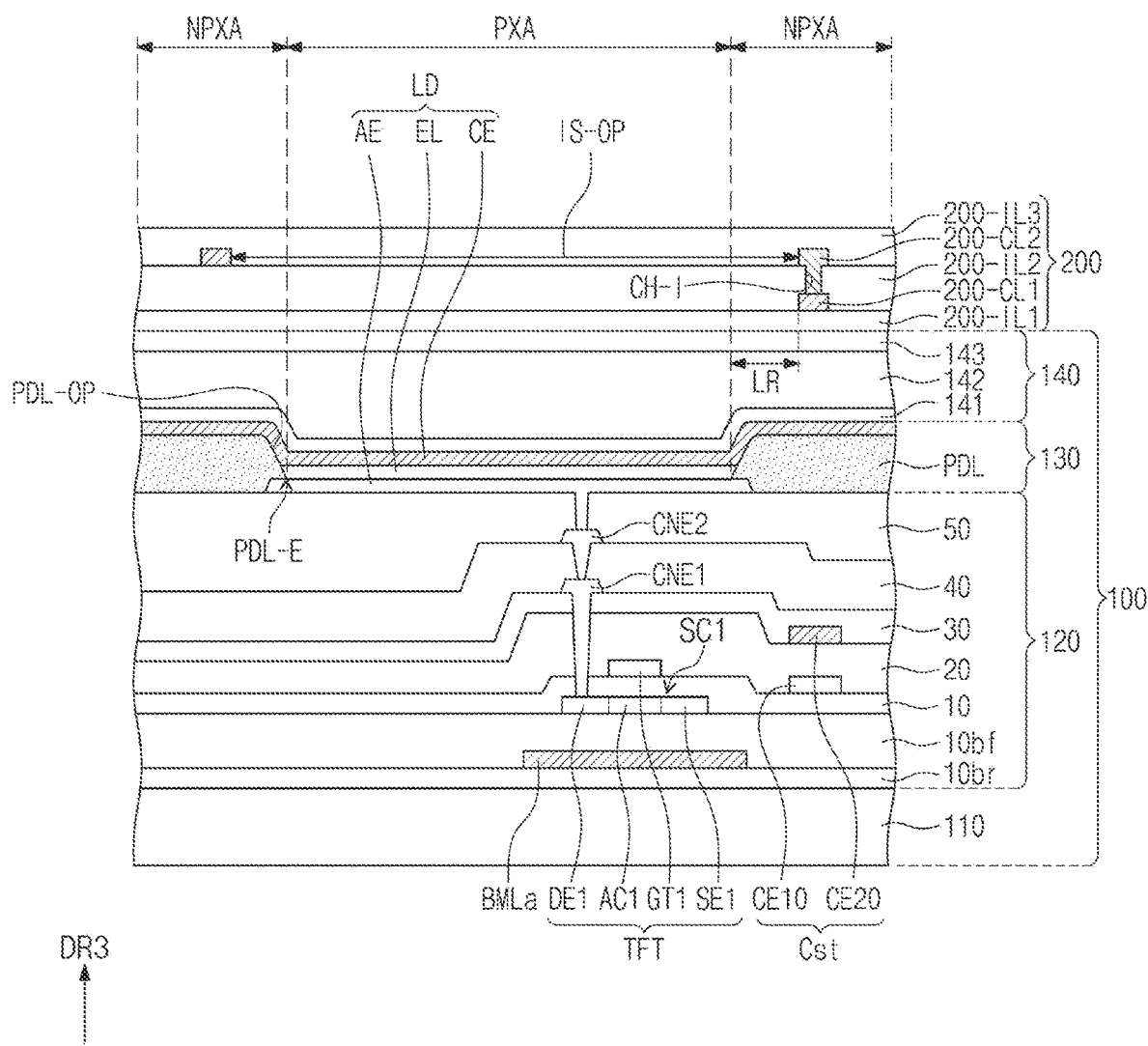
FIG. 6A is a cross-sectional view of an input sensor according to some embodiments of the present disclosure.
Figure 6B:
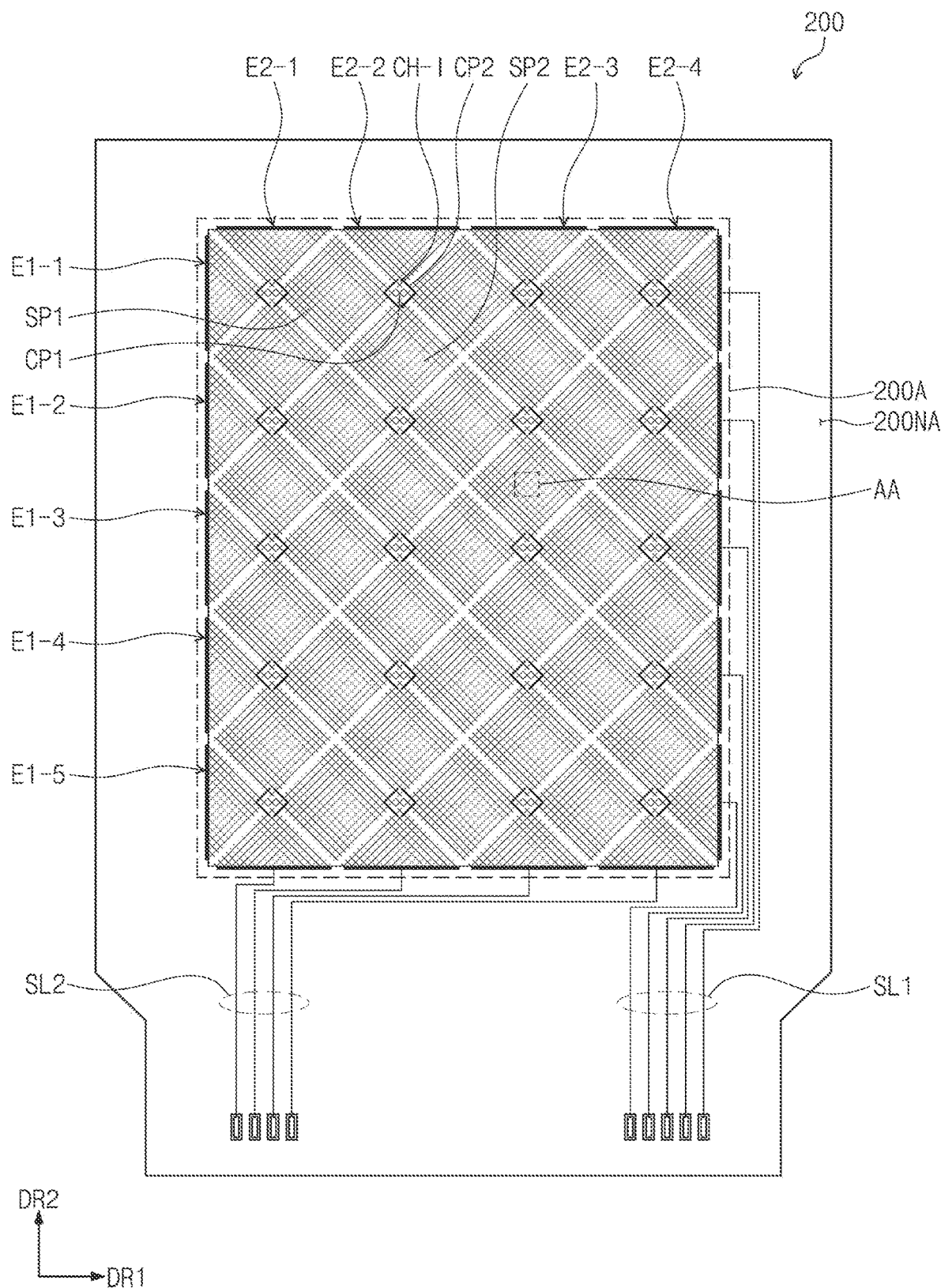
FIG. 6B is a plan view of an input sensor according to some embodiments of the present disclosure.
Figure 6C:
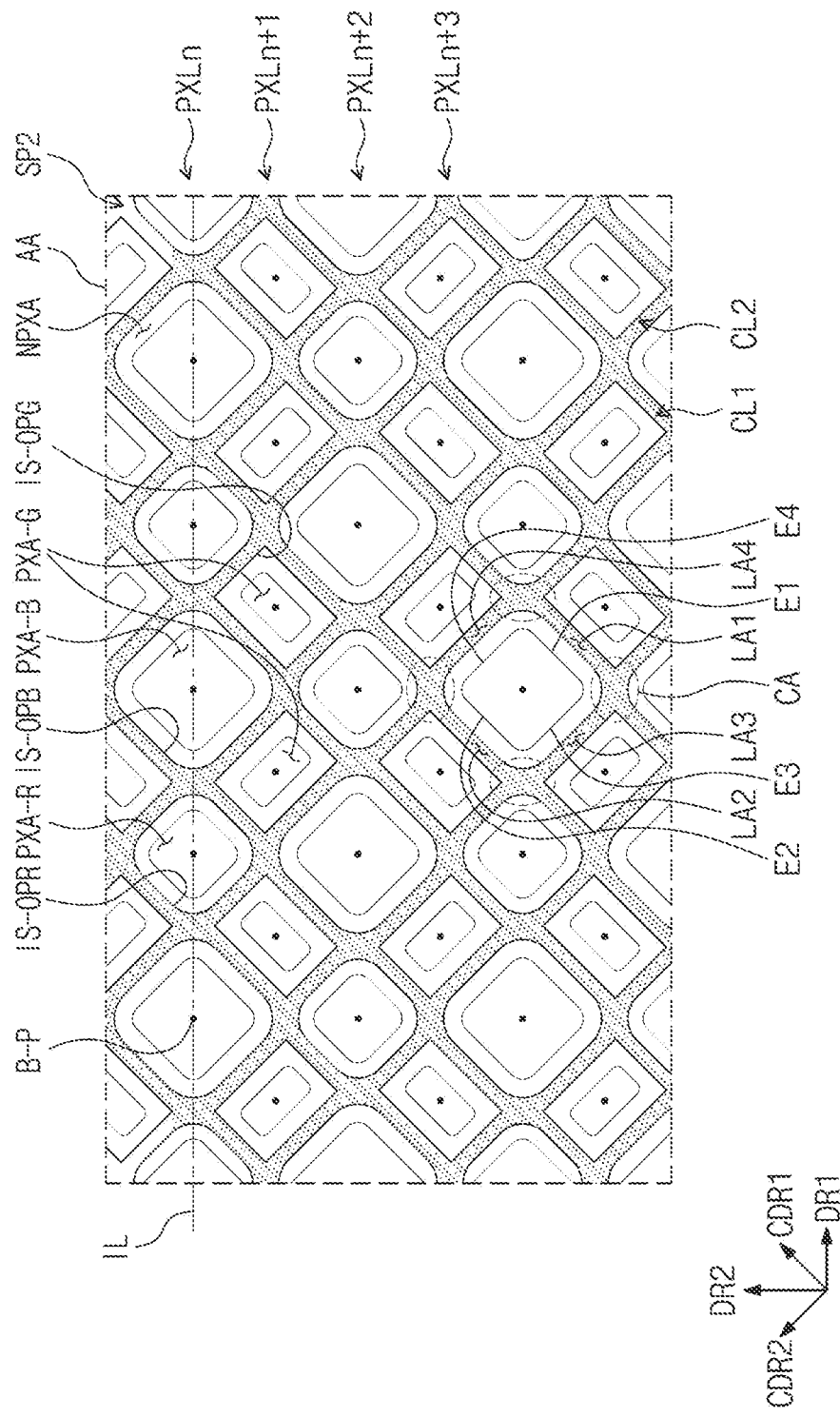
FIG. 6C is an enlarged plan view of a partial area of FIG. 6B according to some embodiments of the present disclosure.

FIG. 6A is a cross-sectional view of an input sensor 200 according to some embodiments of the present disclosure. FIG. 6B is a plan view of an input sensor 200 according to some embodiments of the present disclosure. FIG. 6C is an enlarged plan view of a partial area AA of FIG. 6B.

The input sensor 200 may be directly arranged on a display panel 100. The input sensor 200 may include a first insulating layer 200-IL1 (or a base insulating layer), a first conductive pattern layer 200-CL1, a second insulating layer 200-IL2 (or an intermediate insulating layer), a second conductive pattern layer 200-CL2, and a third insulating layer 200-IL3 (or a cover insulating layer). The first insulating layer 200-IL1 may be directly arranged on an encapsulation layer 140.

According to some embodiments of the present disclosure, the first insulating layer 200-IL1 and/or the third insulating layer 200-IL3 may be omitted. When the first insulating layer 200-IL1 is omitted, the first conductive pattern layer 200-CL1 may be directly arranged on the uppermost insulating layer of the encapsulation layer 140.

The third insulating layer 200-IL3 may be replaced with an insulating layer of an anti-reflector 300 (refer to FIG. 2) located on an adhesive layer or the input sensor 200.

The first conductive pattern layer 200-CL1 may include a first conductive pattern, and the second conductive pattern layer 200-CL2 may include a second conductive pattern. Each of the first conductive pattern and the second conductive pattern may include regularly arranged patterns. Hereinafter, the first conductive pattern layer 200-CL1 and the first conductive pattern are referred to by the same reference numeral, and the second conductive pattern layer 200-CL2 and the second conductive pattern are referred to by the same reference numeral.

Referring to FIG. 6A, the first conductive pattern 200-CL1 and the second conductive pattern 200-CL2 may overlap a non-light emitting area NPXA. An opening IS-OP corresponding to a light emitting area PXA may be defined in the second conductive pattern 200-CL2.

Each of the first conductive pattern 200-CL1 and the second conductive pattern 200-CL2 may have a single-layered structure or may have a structure in which multiple layers are laminated along a third direction DR3. The multi-layered conductive pattern may include at least two or more of transparent conductive layers and metal layers. The multi-layered conductive pattern may include metal layers, each of which includes different metal. The transparent conductive layer may include indium tin oxide (ITO), indium zinc oxide (IZO), zinc oxide (ZnO), indium tin zinc oxide (ITZO), PEDOT, a metal nano-wire, or graphene. The metal layer may include molybdenum, silver, titanium, copper, aluminum, and an alloy thereof.

According to some embodiments, each of the first to third insulating layers 200-IL1 to 200-IL3 may include an inorganic layer or an organic layer. According to some embodiments, each of the first to third insulating layers 200-IL1 to 200-IL3 may include an inorganic layer. The inorganic layer may include silicon oxide, silicon nitride, or silicon oxynitride.

According to some embodiments of the present disclosure, at least one of the first to third insulating layers 200-IL1 to 200-IL3 may be an organic layer. For example, the third insulating layer 200-IL3 may include an organic layer. The organic layer may include at least any one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Referring to FIG. 6B, the input sensor 200 may include a sensing area 200A and a non-sensing area 200NA adjacent to the sensing area 200A. The sensing area 200A and the non-sensing area 200NA may correspond to a display area 1000A and a peripheral area 1000N shown in FIG. 1, respectively.

The input sensor 200 may be located in the sensing area 200A and may include first sensing electrodes E1-1 to E1-5 and second sensing electrodes E2-1 to E2-4, which are insulated and intersect each other. The first sensing electrodes E1-1 to E1-5 includes the first sensing electrodes E1-1, E1-2, E1-3, E1-4 and E1-5; and the second sensing electrodes E2-1 to E2-4 includes the second sensing electrodes E2-1, E2-2, E2-3 and E2-4. The input sensor 200 may calculate the amount of change in mutual capacitance formed between the first sensing electrodes E1-1 to E1-5 and the second sensing electrodes E2-1 to E2-4 to detect an external input.

The input sensor 200 may be located in the non-sensing area 200NA and may include first signal lines SL1 electrically connected with the first sensing electrodes E1-1 to E1-5 and second signal lines SL2 electrically connected with the second sensing electrodes E2-1 to E2-4. The first sensing electrodes E1-1 to E1-5, the second sensing electrodes E2-1 to E2-4, the first signal lines SL1, and the second signal lines SL2 may be defined as each of the first conductive pattern 200-CL1 and the second conductive pattern 200-CL2 described with reference to FIG. 6A or a combination of the first conductive pattern 200-CL1 and the second conductive pattern 200-CL2.

Each of the first sensing electrodes E1-1 to E1-5 and the second sensing electrodes E2-1 to E2-4 may include a plurality of conductive lines intersecting each other. The plurality of conductive lines may define a plurality of openings, and each of the first sensing electrodes E1-1 to E1-5 and the second sensing electrodes E2-1 to E2-4 may have a mesh shape. Each of the plurality of openings may be defined like the opening IS-OP shown in FIG. 6A.

Any one of the first sensing electrodes E1-1 to E1-5 and the second sensing electrodes E2-1 to E2-4 may have an integrated shape. According to some embodiments, the first sensing electrodes E1-1 to E1-5 having the integrated shape are illustrative. The first sensing electrodes E1-1 to E1-5 may include sensing portions SP1 and middle portions CP1. A portion of the above-mentioned second conductive pattern 200-CL2 may correspond to the first sensing electrodes E1-1 to E1-5.

Each of the second sensing electrodes E2-1 to E2-4 may include sensing patterns SP2 and bridge patterns CP2 (or connection patterns). The two sensing patterns SP2 adjacent to each other may be connected with the two bridge patterns CP2 through a contact hole CH-I (refer to FIG. 6A) penetrating the second insulating layer 200-IL2 (refer to FIG. 6A), but the number of bridge patterns is not limited thereto. A portion of the above-mentioned second conductive pattern 200-CL2 may correspond to the sensing patterns SP2. A portion of the above-mentioned first conductive pattern 200-CL1 may correspond to the bridge patterns CP2.

According to some embodiments, it is described that the bridge patterns CP2 are formed from the first conductive pattern 200-CL1 shown in FIG. 6A and that the first sensing electrodes E1-1 to E1-5 and the sensing patterns SP2 are formed from the second conductive pattern 200-CL2 shown in FIG. 6A, but not limited thereto. The first sensing electrodes E1-1 to E1-5 and the sensing patterns SP2 may be formed from the first conductive pattern 200-CL1 shown in FIG. 6A, and the bridge patterns CP2 may be formed from the second conductive pattern 200-CL2 shown in FIG. 6A.

Any one of the first signal lines SL1 and the second signal lines SL2 may deliver a transmit signal for sensing an external input from an external circuit, and the other may deliver a change in capacitance between the first sensing electrodes E1-1 to E1-5 and the second sensing electrodes E2-1 to E2-4 as a receive signal to the external circuit.

A portion of the above-mentioned second conductive pattern 200-CL2 may correspond to the first signal lines SL1 and the second signal lines SL2. The first signal lines SL1 and the second signal lines SL2 may have a double-floor structure and may include a first floor line formed from the above-mentioned first conductive pattern 200-CL1 and a second floor line formed from the above-mentioned second conductive pattern 200-CL2. The first floor line and the second floor line may be connected with each other through a contact hole penetrating a second insulating layer 200-IL2 (refer to FIG. 6A).

FIG. 6C illustrates an enlarged view of the sensing pattern SP2 to describe the first sensing electrodes E1-1 to E1-5 and the second sensing electrodes E2-1 to E2-4, which have the mesh shape shown in FIG. 6B. Other portions of the first sensing electrodes E1-1 to E1-5 and the second sensing electrodes E2-1 to E2-4, may also have the same shape as the sensing patterns SP2 shown in FIG. 6C.

According to some embodiments, a single line area of a conductive line CL1 or CL2 shown in FIG. 6C may be defined at the boundary of the first sensing electrodes E1-1 to E1-5 and the second sensing electrodes E2-1 to E2-4. In the present disclosure, the conductive line CL1 and the conductive line CL2 may be referred as a first line CL1 and a second line CL2, respectively.

Referring to FIG. 6C, first, second, and third openings IS-OPR, IS-OPG, and IS-OPB corresponding to first, second, and third color light emitting areas PXA-R, PXA-G, and PXA-B may be defined in the sensing pattern SP2. The sensing pattern SP2 may include the first lines CL1 overlapping the non-light emitting area NPXA and extending in a first oblique direction CDR1 and the second lines CL2 extending in a second oblique direction CDR2. The first lines CL1 and the second lines CL2 intersect each other and may define the first, second, and third openings IS-OPR, IS-OPG, and IS-OPB corresponding to the first, second, and third color light emitting areas PXA-R, PXA-G, and PXA-B. Thus, the sensing pattern SP2 may have a grid shape or a mesh shape. However, each of the first lines CL1 may not be a perfect straight shape in the first oblique direction CDR1 and may include a plurality of straight areas and a plurality of inflection areas. The second lines CL2 may also include a plurality of straight areas and a plurality of inflection areas.

The sensing pattern SP2 may include a first line area LA1 and a second line area LA2 facing each other in the second oblique direction CDR2 around each of the first, second, and third openings IS-OPR, IS-OPG, and IS-OPB and a third line area LA3 and a fourth line area LA4 facing each other in the first oblique direction CDR1. The first line area LA1 and the second line area LA2 may be some of the first lines CL1, and the third line area LA3 and the fourth line area LA4 may be some of the second lines CL2. Each of the first line area LA1, the second line area LA2, the third line area LA3, and the fourth line area LA4 may be an area having a uniform line width.

The first line area LA1, the second line area LA2, the third line area LA3, and the fourth line area LA4 may be arranged adjacent to a first edge E1, a second edge E2, a third edge E3, and a fourth edge E4, respectively. The first line area LA1, the second line area LA2, the third line area LA3, and the fourth line area LA4 may be arranged parallel to the first edge E1, the second edge E2, the third edge E3, and the fourth edge E4, respectively.

The interval between a corresponding line area and a corresponding edge is illustrated as the constant sensing pattern SP2 according to some embodiments, but embodiments are not limited thereto. When each of the first, second, and third color light emitting areas PXA-R, PXA-G, and PXA-B has a shape different from a corresponding opening among the first, second, and third openings IS-OPR, IS-OPG, and IS-OPB, the interval between the line area and the edge may not be constant.

An intersection area CA may be arranged between the adjacent line areas. The intersection area CA may have a line width greater than at least an adjacent line area. It may be seen that the line width of the first line area LA1 is compared with the line width of the intersection area CA defined between the first line area LA1 and the third line area LA3.

Figure 7A:
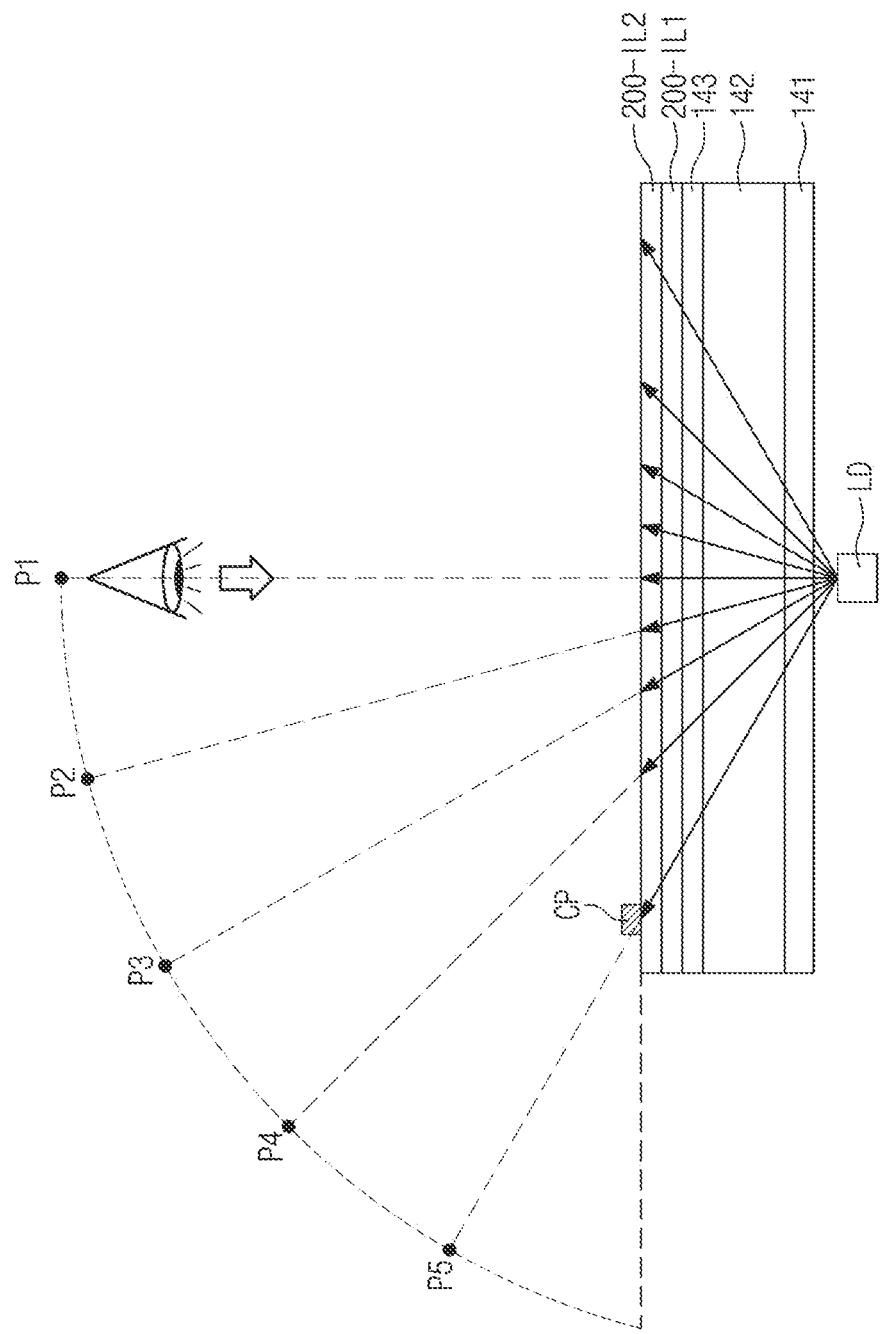
FIG. 7A is a cross-sectional view illustrating a radiation path of source light according to some embodiments of the present disclosure.
Figure 7B:
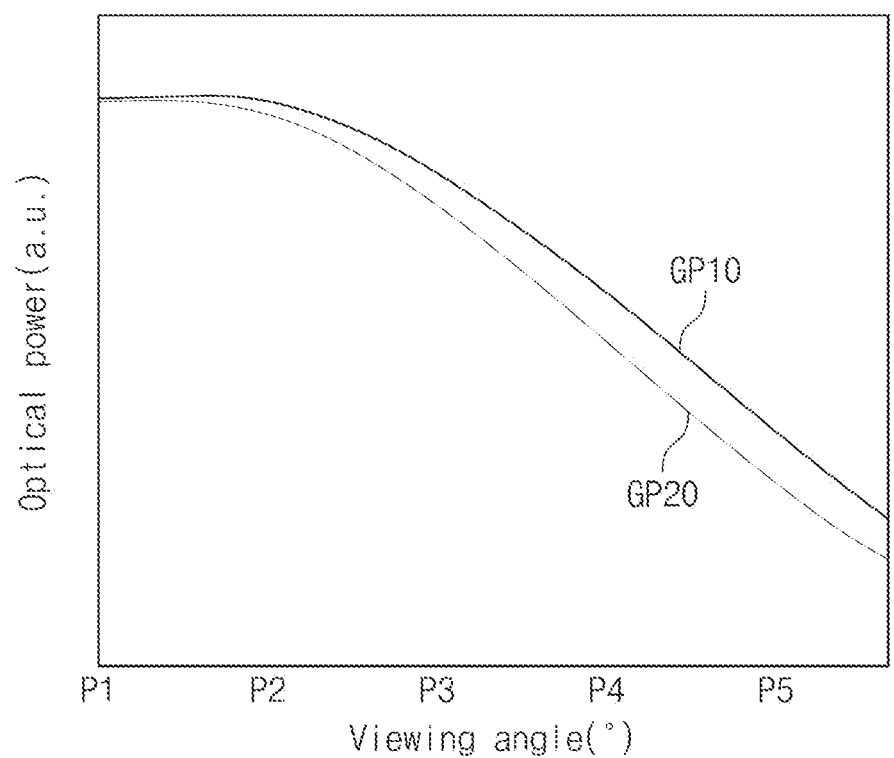
FIG. 7B is a graph illustrating the amount of change in light source intensity according to a viewing angle according to some embodiments of the present disclosure.

FIG. 7A is a cross-sectional view illustrating a radiation path of source light. FIG. 7B is a graph illustrating the amount of change in light intensity according to a viewing angle.

FIG. 7A schematically illustrates a display device DD shown in FIG. 6A. Source light generated by a light emitting element LD may be radiated to a front surface of the display device DD. A conductive pattern CP may correspond to a light shielding pattern which blocks source light. The light emitting shape of the source light may be deformed from a radial shape by the blocking of the conductive pattern CP.

Referring to FIG. 7B, a first graph GP10 and a second graph GP20 illustrate the amount of change in light intensity (or optical power) according to a viewing angle. The first graph GP10 is measured in a state where a conductive pattern CP of FIG. 7A is omitted, and the second graph GP20 is measured in a state where the conductive pattern CP is located. Referring to FIGS. 7A and 7B, the conductive pattern CP located between a measurement point and a light source point may correspond to a light shielding pattern for source light. Alternatively, the more the viewing angle increases, the more the light shielding effect increases.

According to the present disclosure, WAD described with reference to FIG. 4 may be reduced using the light shielding function of the conductive pattern CP described with reference to FIGS. 7A and 7B. A detailed description thereof refers to FIG. 8A below.

Figure 8A:
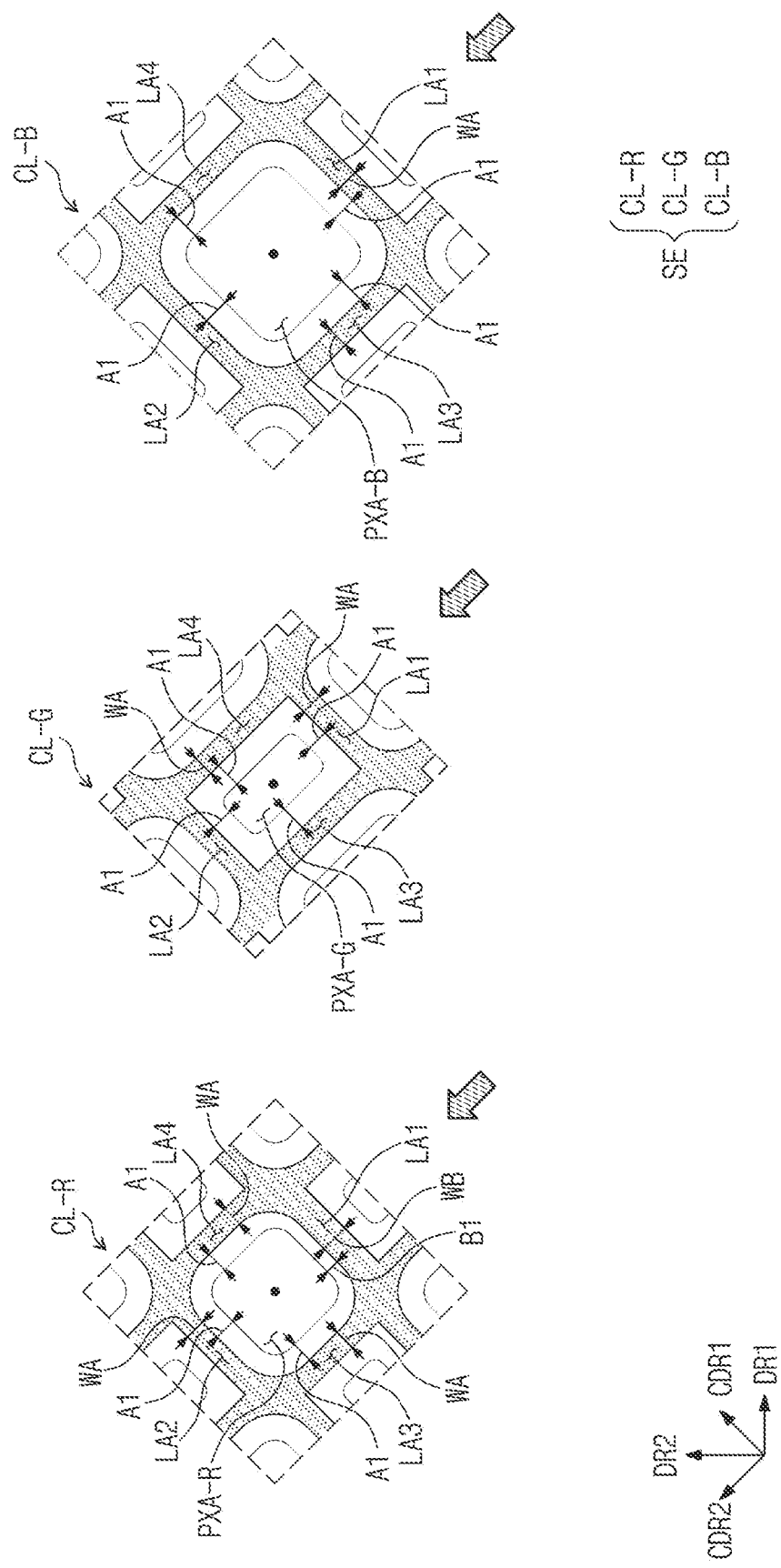
FIG. 8A is a plan view illustrating an arrangement relationship between light emitting areas and a sensing electrode according to some embodiments of the present disclosure.
Figure 8B:
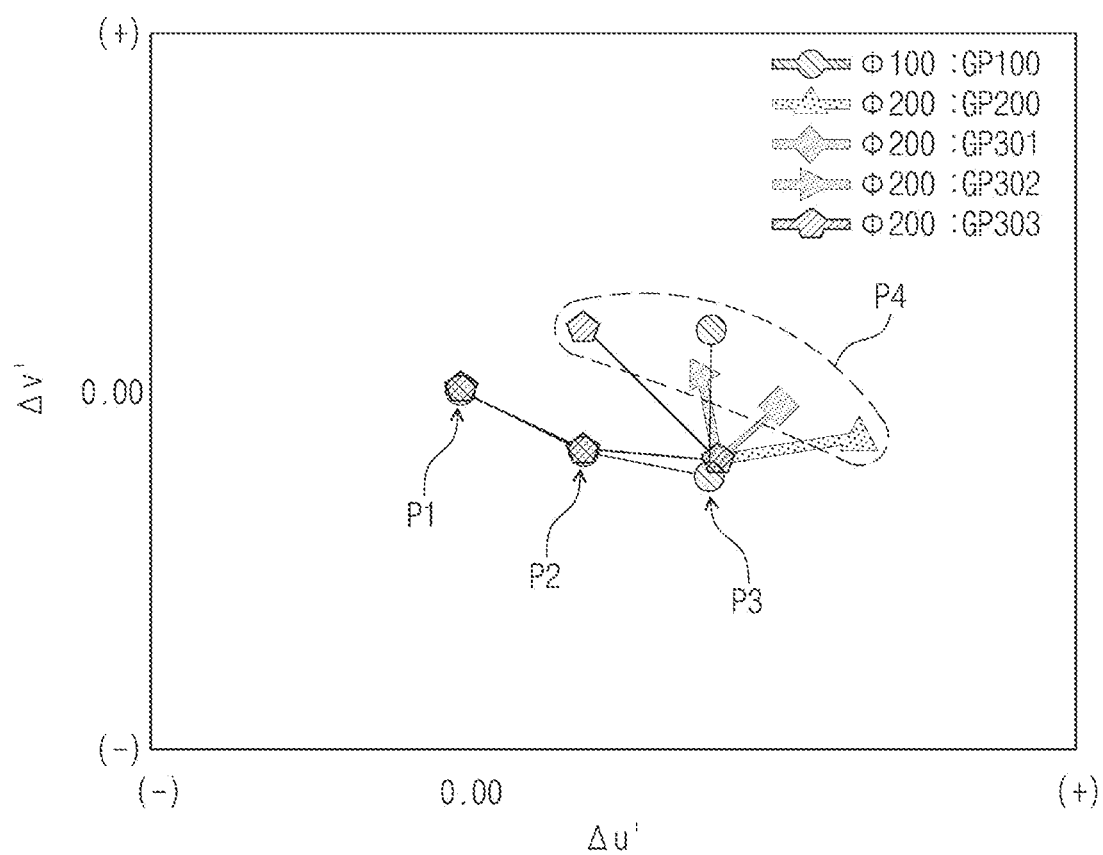
FIG. 8B is a graph illustrating the amount of change in color coordinates according to a distance between a first color light emitting area and a sensing electrode according to some embodiments of the present disclosure.

FIG. 8A is a plan view illustrating an arrangement relationship between light emitting areas PXA-R, PXA-G, and PXA-B and a sensing electrode SE according to some embodiments of the present disclosure. FIG. 8B is a graph illustrating the amount of change in color coordinates according to a distance between a first color light emitting area PXA-R and a sensing electrode SE according to some embodiments of the present disclosure.

The sensing electrode SE shown in FIG. 8A may be a portion of a sensing electrode SP2 shown in FIG. 6C, which is illustrated in detail compared with FIG. 6C. Hereinafter, a detailed description of the same components as the components described with reference to FIG. 6C will be omitted.

An arrow shown in FIG. 8A refers to a direction facing the sensing electrode SE from a measurement point where WAD described with reference to FIG. 4 is measured (briefly referred as "the direction of the measurement point of WAD" hereinafter). According to some embodiments, as described with reference to FIG. 4, the measurement point where the WAD is measured may have a third azimuth angle $\phi30$ and a fifth viewing angle $\theta5$ (refer to FIG. 3). Furthermore, it is described that a reddish white image is measured. As will be described later, the measurement point where WAD is measured is located adjacent to a first area LA1 than to a second area LA2.

The sensing electrode SE may include a first conductive line CL-R defining a first opening IS-OPR (refer to FIG. 6C), a second conductive line CL-G defining a second opening IS-OPG, and a third conductive line CL-B defining a third opening IS-OPB. Each of the first conductive line CL-R, the second conductive line CL-G, and the third conductive line CL-B may be formed by a combination of two first lines CL1 (refer to FIG. 6C) and two second lines CL2 (refer to FIG. 6C), which are described above.

Each of the first conductive line CL-R, the second conductive line CL-G, and the third conductive line CL-B may include a first area LA1, a second area LA2, a third area LA3, and a fourth area LA4 corresponding to a first line area LA1, a second line area LA2, a third line area LA3, and a fourth line area LA4 described with reference to FIG. 6C. Corresponding areas among the first to fourth line areas LA1 to LA4 and the first to fourth areas LA1 to LA4 refer to the same reference numerals.

A distance between a corresponding light emitting area PXA-R, PXA-G, or PXA-B and a corresponding line area LA1 or LA2 may be about 15 to 20 micrometers. A distance B1 between the first color light emitting area PXA-R and the first area LA1 may be less than a distance A1 between the second color light emitting area PXA-G and the first area LA1 and a distance A1 between the third color light emitting area PXA-B and the first area LA1. The first color light emitting area PXA-R and the first area LA1 may be arranged relatively close to each other such that less first color light is provided in the direction of the measurement point of WAD. The distances A1 and B1 may be measured by a criterion such as a distance LR shown in FIG. 6A. In other words, like the distance LR shown in FIG. 6A, an interval (e.g., distance Lr) between an edge PDL-E of a pixel definition layer PDL defining the light emitting area PXA and an edge of a conductive pattern included in a second conductive pattern layer 200-CL2 may be measured as a distance (e.g., distances A1 and B1).

The first area LA1 extending in a direction perpendicular to the direction of the measurement point of WAD may shield first color light in the direction of the measurement point of WAD. When the measurement point of WAD is defined as a first point (r1, $\theta1$, $\phi1$), a vertical direction (i.e., the direction perpendicular to the direction of the measurement point of WAD) may be a direction where a second point (r1, $\theta1$, $\phi1+180°$) and a third point (r0, $\theta1$, $\phi1-90°$ are connected with each other.

A line width WB of the first area LA1 of the first conductive line CL-R may be greater than a line width WA of the first area LA1 of the second conductive line CL-G and the third conductive line CL-B. The line width WB of the first area LA1 of the first conductive line CL-R may be greater than a line width WA of second to fourth areas LA2 to LA4 of the first conductive line CL-R. The second conductive line CL-G and the third conductive line CL-B may have the same line width WA irrespective of the first to fourth areas LA1 to LA4.

Further increasing the line width of the specific area to increase light shielding efficiency in the specific direction is described as an example according to some embodiments, but a line thickness of the specific area may increase to increase light shielding efficiency in the specific direction.

When less red source light is provided toward the measurement point of WAD, as the amount $\Delta u'$ of change of color coordinates u' described with reference to FIG. 4 is reduced, a WAD phenomenon may be reduced. For example, a thickness of the first area LA1 of the first conductive line CL-R adjacent to the first color light emitting area PXA-R may be greater than a thickness of the first area LA1 of the second conductive line CL-G adjacent to the second color light emitting area PXA-G and a thickness of the first area LA1 of the third conductive line CL-B adjacent to the third color light emitting area PXA-B.

FIG. 8B illustrates five simulation results. Referring to FIGS. 8A and 8B, unlike FIG. 8A, in a first graph GP100 and a second graph GP200, a distance B1 between the first color light emitting area PXA-R and the first area LA1, a distance A1 between the second color light emitting area PXA-G and the first area LA1, and a distance A1 between the third color light emitting area PXA-B and the first area LA1 are measured in the same condition. The first graph GP100 is measured at a first azimuth angle φ100, and the second graph GP200 is measured at a second azimuth angle φ200. The second azimuth angle φ200 may be greater than the first azimuth angle φ100 by 45°. The first azimuth angle φ100 may be the same as a second azimuth angle φ20 of FIG. 4, and the second azimuth angle φ200 may be the same as a third azimuth angle φ30 of FIG. 4. Third to fifth graphs GP301 to GP303 indicate the amount of change in color coordinates of a display device shown in FIG. 8A. The fourth graph GP302 is measured under the condition that the distance B1 between the first color light emitting area PXA-R and the first area LA1 is less than that in third graph GP301 by one micrometer. The fifth graph GP303 is measured under the condition that the distance B1 between the first color light emitting area PXA-R and the first area LA1 is less than that in the fourth graph GP302 by one micrometer. The third to fifth graphs GP301 to GP303 are measured at the second azimuth angle φ200.

Four measurement points P1 to P4 may have different viewing angles θ. As going from first measurement point P1 to the fourth measurement point P4, the viewing angle θ increases.

Referring to third to fifth graphs GP301 to GP303 and FIG. 8A, it may be seen that the closer the distance B1 between the first color light emitting area PXA-R and the first area LA1, the more the coordinates of the amounts Δu' and Δv' of change in color coordinates measured at the fourth measurement point P4 having the largest viewing angle change to the left. This is because the closer the first color light emitting area PXA-R (refer to FIG. 8A) and the first area LA1 (refer to FIG. 8A), the more the light shielding efficiency of the first area LA1 increases.

It may be seen that the coordinates of the amounts Δu' and Δv' of change in color coordinates at the fourth measurement point P4 of the fifth graph GP303 deviate from a reddish white area and are close to coordinates of the amounts Δu' and Δv' of change in color coordinates at the first measurement point P1. The closer the distance B1 between the first color light emitting area PXA-R and the first area LA1, the more the light shielding effect increases and the more the amount of change in color coordinates decreases.

Referring again to FIG. 8A, the distance B1 between the first color light emitting area PXA-R and the first area LA1 may be less than the distance A1 between the first color light emitting area PXA-R and the second area LA2. By comparison, the distance A1 between the second color light emitting area PXA-G and the first area LA1 may be the same as the distance A1 between the second color light emitting area PXA-G and the second area LA2. The distance A1 between the third color light emitting area PXA-B and the first area LA1 may be the same as the distance A1 between the third color light emitting area PXA-B and the second area LA2. The distance A1 between the first color light emitting area PXA-R and the second area LA2 may be substantially the same as the distance A1 between the second color light emitting area PXA-G and the second area LA2 and the distance A1 between the third color light emitting area PXA-B and the second area LA2.

Source light of intensity where four different directions or azimuth angles are substantially uniform toward four different points may be provided from each of the second color light emitting area PXA-G and the third color light emitting area PXA-B. There is an azimuth angle difference of 90° between two points adjacent to each other among four points. The four points may include a first point (r1, θ1, φ1) adjacent to the first area LA1, a second point (r1, θ1, φ1+180°) adjacent to the second area LA2, a third point (r1, θ1, φ1−90° adjacent to the third area LA3, and a fourth point (r1, θ1, φ1+90° adjacent to the fourth area LA4.

Figure 9A:
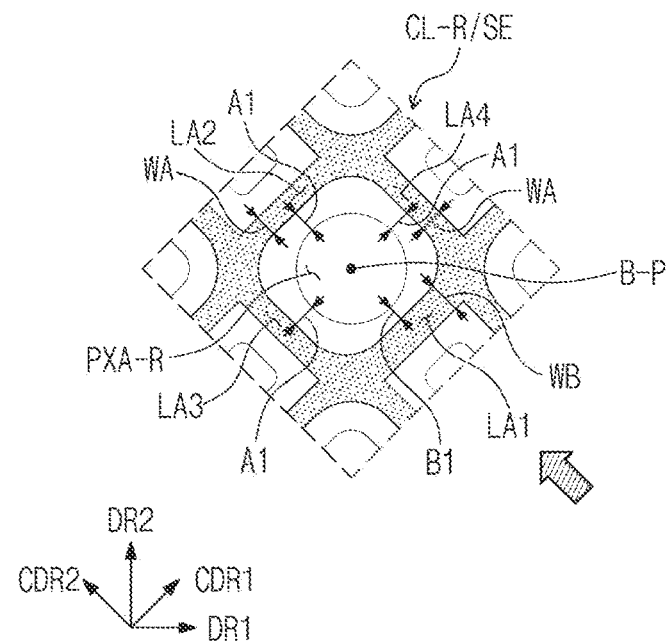
Figure 9B:
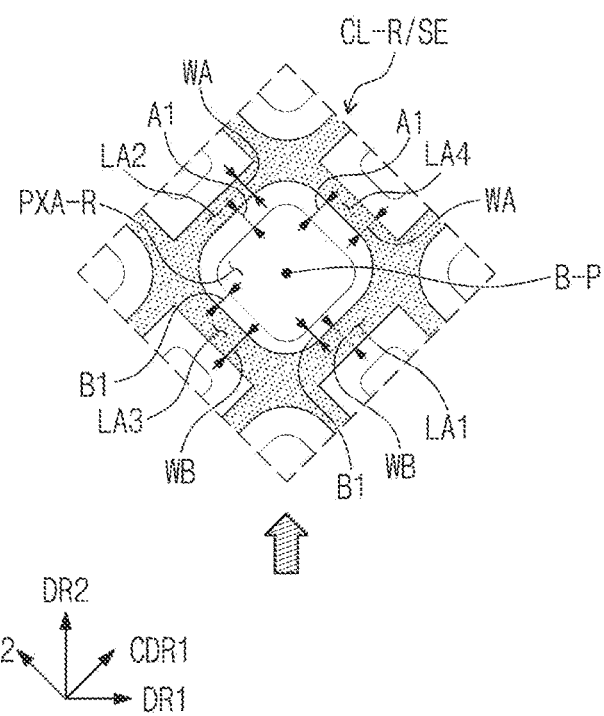

FIGS. 9A to 9C are plan views illustrating an arrangement relationship between light emitting areas PXA-R, PXA-G, and PXA-B and a sensing electrode SE according to some embodiments of the present disclosure. Hereinafter, a detailed description of the same configuration as the configuration described with reference to FIGS. 6A to 8B will be omitted.

A first color light emitting area PXA-R is illustrated on behalf of light emitting areas PXA-R, PXA-G, and PXA-B in FIG. 9A. The first color light emitting area PXA-R may have a circular shape or an oval shape.

A distance B1 between a first area LA1 and the first color light emitting area PXA-R may be non-uniform. Each of a second area LA2, a third area LA3, and a fourth area LA4 may have a non-uniform distance from the first color light emitting area PXA-R.

A distance B1 and A1 between the first area LA1, the second area LA2, the third area LA3, and the fourth area LA4 and the first color light emitting area PXA-R may be measured as the shortest distance. The distance B1 between the first area LA1 and the first color light emitting area PXA-R may be less than a distance A1 between the other areas and the first color light emitting area PXA-R.

FIG. 9B illustrates embodiments where measurement points of WAD are different from each other. An example in which a reddish white image is measured at a point of (r, 60°, 90°) is illustrated. According to some embodiments, to prove less red source light at an azimuth angle of 90°, a distance B1 between the first color light emitting area PXA-R and the first area LA1 and a distance B1 between the first color light emitting area PXA-R and the third area LA3 may be less than a distance A1 between the first color light emitting area PXA-R and the second area LA2 and a distance B1 between the first color light emitting area PXA-R and the fourth area LA4. The distance A1 between the second color light emitting area PXA-G and the third area LA3 and the distance A1 between the third color light emitting area PXA-B and the third area LA3 may be the same as the distance A1 shown in FIG. 8B. That is, the distance B1 between the first color light emitting area PXA-R and the third area LA3 is equal to the distance A1 between the second color light emitting area PXA-G and the third area LA3 and the second color light emitting area LA3. It may be smaller than the distance A1 between the third color light emitting area PXA-B and the third area LA3.

Unlike the presence of one area (e.g., the first area LA1) most adjacent to the measurement point of WAD in the embodiments described with respect to FIG. 9A, there are two areas (e.g., the first area LA1 and the second area LA3) having the same condition with respect to the measurement point of WAD in the embodiments described with respect to FIG. 9B. To reduce WAD, both the first area LA1 and the third area LA3 are arranged closer to the first color light emitting area PXA-R.

Referring to FIG. 9C, WAD may be measured at two or more points. According to some embodiments, two WAD measurement points are illustrated by arrows. The first measurement point may be the same as a measurement point of FIG. 8A.

A design of a sensing electrode SE may be changed based on the second measurement point. A distance between any one of the second color light emitting area PXA-G and the third color light emitting area PXA-B and any one of the second to fourth areas LA2 to LA4 may be less than a distance between the other of the second color light emitting area PXA-G and the third color light emitting area PXA-B and the any one of the second to fourth areas LA2 to LA4. Furthermore, the distance between the any one of the second color light emitting area PXA-G and the third color light emitting area PXA-B and the any one of the second to fourth areas LA2 to LA4 may be less than a distance between the first color light emitting area PXA-R and the any one of the second to fourth areas LA2 to LA4.

Hereinafter, measuring a bluish white image at the second measurement point having coordinates of (r, 60°, 225°) is described as an example. To prevent or reduce instances of WAD generated at the second measurement point, a distance Cl between the third color light emitting area PXA-B the fourth area LA4 may be less than a distance A1 between the first color light emitting area PXA-R and the fourth area LA4 and a distance A1 between the second color light emitting area PXA-G and the fourth area LA4. The third color light emitting area PXA-B and the fourth area LA4 may be arranged close to each other such that less third color light is provided toward the second measurement point. A line width WC of the fourth area LA4 adjacent to the third color light emitting area PXA-B may be greater than a line width WA of the first to third areas LA1 to LA3 adjacent to the third color light emitting area PXA-B.

A distance Cl between the third color light emitting area PXA-B and the fourth area LA4 may be less than a distance A1 between the third color light emitting area PXA-B and the third area LA3. By comparison, the distance A1 between the second color light emitting area PXA-G and the fourth area A4 may be the same as the distance A1 between the second color light emitting area PXA-G and the third area LA3. The distance A1 between the first color light emitting area PXA-R and the fourth area LA4 may be the same as the distance A1 between the first color light emitting area PXA-R and the third area LA3.

Figure 10A:
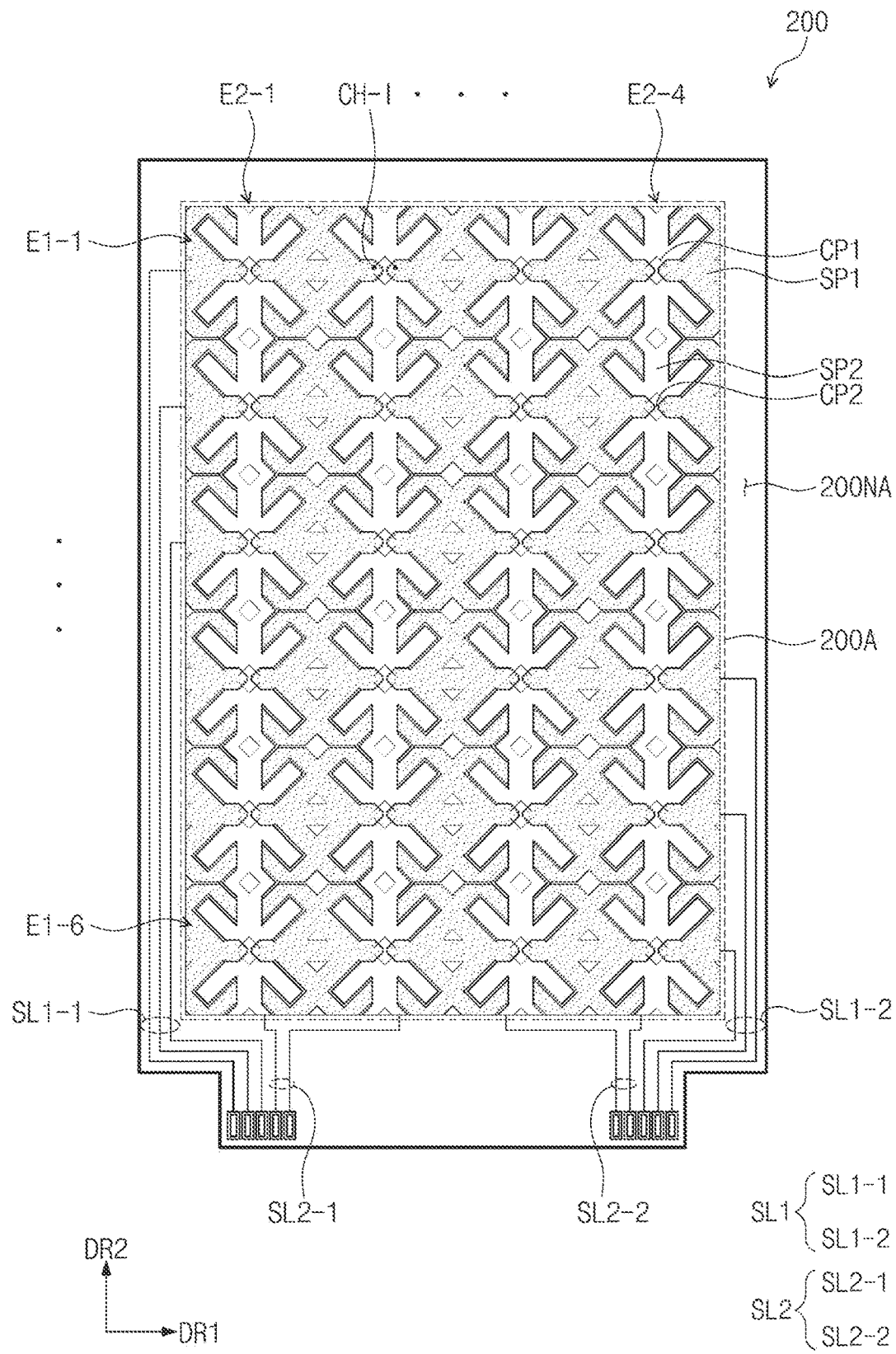
FIG. 10A is a plan view of an input sensor according to some embodiments of the present disclosure.
Figure 10B:
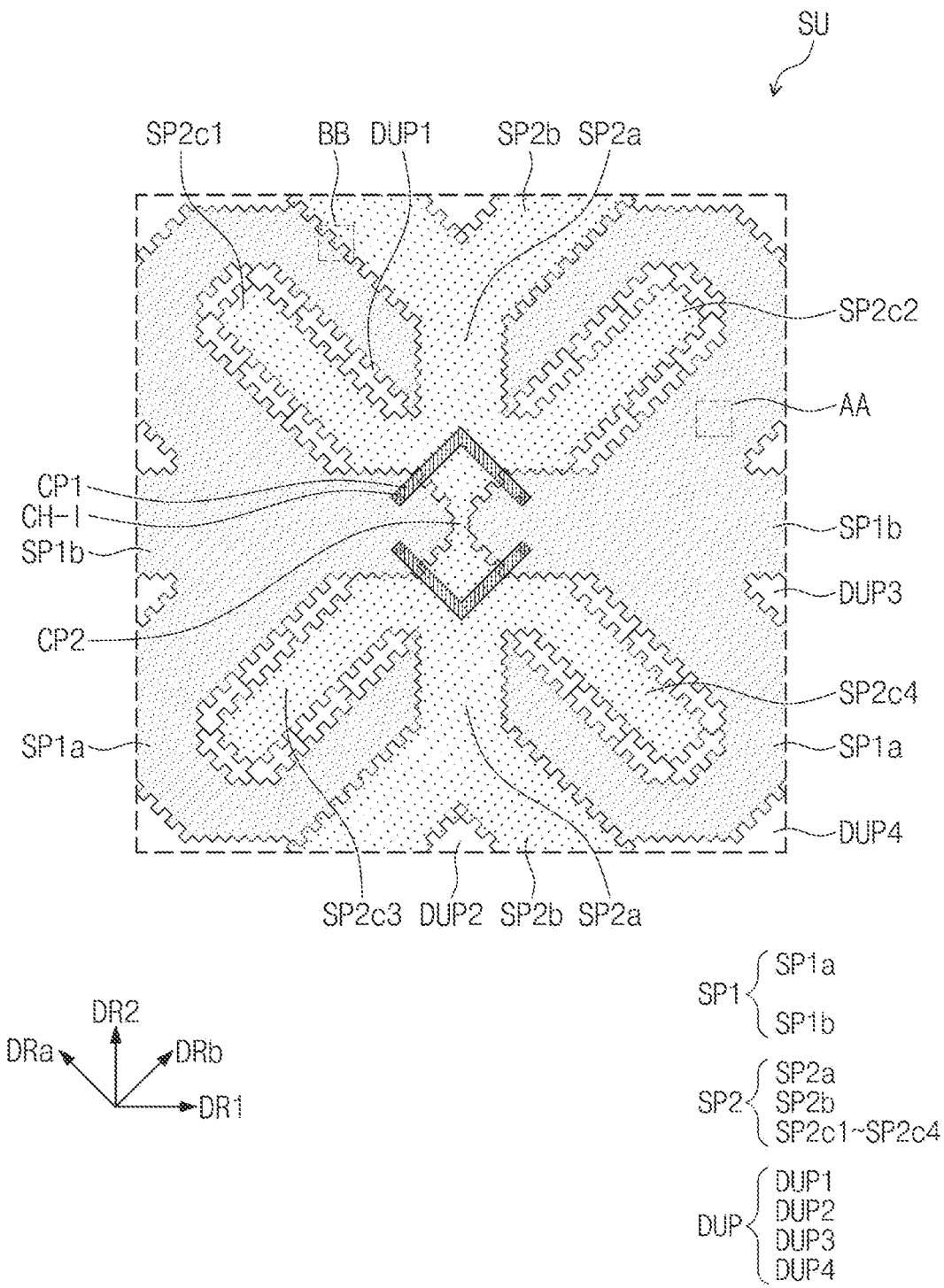
FIG. 10B is an enlarged plan view of a sensing unit shown in FIG. 10A according to some embodiments of the present disclosure.

FIG. 10A is a plan view of an input sensor 200 according to some embodiments of the present disclosure. FIG. 10B is an enlarged plan view of a sensing unit SU shown in FIG. 10A.

Hereinafter, a description will be given in detail of an input sensor 200 according to some embodiments that are different from an input sensor 200 shown in FIG. 6B. However, a duplicated description of the same configuration as the input sensor 200 described with reference to FIG. 6B will be omitted. The structure and the feature of the sensing electrode described with reference to FIGS. 8A to 9C are also applicable to the input sensor 200 described below, and the above-mentioned WAD reduction effect may also occur in the input sensor 200 described below.

The input sensor 200 shown in FIG. 10A is illustrated to have a different configuration below from the input sensor 200 shown in FIG. 4. Referring to FIG. 10A, sixth first sensing electrodes E1-1 to E1-6 are illustrated as an example. A first group SL1-1 among first signal lines SL1 may be connected with one end of some of the first sensing electrodes E1-1 to E1-6. A second group SL1-2 among the first signal lines SL1 may be connected with the other end of the others of the first sensing electrodes E1-1 to E1-6. A first group SL2-1 among second signal lines SL2 may be connected with one end of some of the second sensing electrodes E2-1 to E2-4. A second group SL2-2 among the second signal lines SL2 may be connected with the other end of the others of the second sensing electrodes E2-1 to E2-4. The first group SL1-1 of the first signal lines SL1 and the first group SL2-1 of the second signal lines SL2 may be aligned, and the second group SL1-2 of the first signal lines SL1 and the second group SL2-2 of the second signal lines SL2 may be aligned.

According to some embodiments, each of the first sensing electrodes E1-1 to E1-6 may include sensing patterns or sensing portions SP1 and bridge patterns CP1. Each of the second sensing electrodes E2-1 to E2-4 may include sensing portions or sensing patterns SP2 of an integrated shape and middle portions CP2. Each of the sensing electrodes E1-1 to E1-6 and the second sensing electrodes E2-1 to E2-4 may have a mesh shape. In other words, each of the first sensing electrodes E1-1 to E1-6 and the second sensing electrodes E2-1 to E2-4 may include a plurality of conductive lines which intersect each other to form a mesh.

According to some embodiments, a sensing area 200A may include a plurality of sensing units SU. All of the sensing area 200A may be divided into the plurality of sensing units SU, or a portion of the sensing area 200A may be divided into the plurality of sensing units SU.

Each of the sensing units SU may have the same area. According to some embodiments, each of the sensing units SU may include a corresponding intersection area among intersection areas of the first sensing electrodes E1-1 to E1-6 and the second sensing electrodes E2-1 to E2-4.

Each of the sensing units SU may include a half of sensing pattern SP1 and the other half of sensing pattern SP1 arranged across the bridge pattern CP and may include a half of sensing portion SP2 and the other half of sensing portion SP2 arranged across the middle portion CP2.

Referring to FIG. 10B, each of the sensing portions SP2 may include extension portions SP2$a$ and SP2$b$ and branch portions SP2$c$1 to SP2$c$4. The extension portions SP2$a$ and SP2$b$ may include the first extension portion SP2$a$ which extends side by side along the first direction DR1 and the second extension portion SP2$b$ which is bent from the first extension portion SP2$a$ and extends across a second dummy pattern DUP2. Meanwhile, the present disclosure is not limited thereto. The second dummy pattern DUP2 of some embodiments may not be located between the second extension portions SP2$b$, and the second extension portion SP2$b$ may extend in a direction parallel to the first extension portion SP2$a$.

Each of the branch portions SP2$c$1 to SP2$c$4 may extend along a direction away from the middle portion CP2 across the middle portion CP2. The branch portions SP2$c$1 to SP2$c$4 may include first to fourth branch portions SP2$c$1 to SP2$c$4. The first branch portion SP2$c$1 and fourth branch portion SP2$c$4 may extend along a first intersection direction DRa, and the second branch portion SP2$c$2 and the third branch portion SP2$c$3 may extend along a second intersection direction DRb. The first intersection direction DRa may be parallel to a second oblique direction CDR2 shown in FIG. 6C, or an angle between acute angles may be defined therebetween. The second intersection direction DRb may be parallel to a first oblique direction CDR1 shown in FIG. 6C, or an angle between acute angles may be defined therebetween.

The first intersection direction DRa may be defined as a direction intersecting each of a first direction DR1 and a second direction DR2. The second intersection direction DRb may be defined as a direction which is orthogonal to the first intersection direction DRa at the same time as intersecting each of the first direction DR1 and the second direction DR2. Each of the first intersection direction DRa and the second intersection direction DRb may correspond to a diagonal direction between the first direction DR1 and the second direction DR2 on a surface defined by the first direction DR1 and the second direction DR2.

The first to fourth branch portions SP2c1 to SP2c4 may move away from each other in opposite directions. For example, the first branch portion SP2c1 may move away from the second branch portion SP2c2 in the first direction DR1 and may move away from the third branch portion SP2c3 in the second direction DR2. The first branch portion SP2c1 may move away from the fourth branch portion SP2c4 across the middle portion CP2 in the first intersection direction DRa.

The middle portion CP2 may be located between portions which protrude toward each other in the first direction DR1 of the sensing patterns SP1. The middle portion CP2 may connect between the first extension portions SP2a of the sensing portions SP2. The middle portion CP2 may be integrally formed on the same layer as the first extension portions SP2a.

Each of the sensing patterns SP1 may include a first portion SP1b which extends along the first direction DR1 and a second portion SP1a which extends from the first portion SP1b and surrounds one portion of the sensing portions SP2. The second portion SP1a of the sensing patterns SP1 may surround branch portions SP2c1 to SP2c4 of the sensing portion SP2 located adjacent thereto. Referring to FIG. 10B, the second portion SP1a of the sensing pattern SP1 located at the left in the sensing unit SU may surround the first and third branch portions SP2c1 and SP2c3, and the second portion SP1a of the sensing pattern SP1 located at the right may surround the second and fourth branch portions SP2c2 and SP2c4.

The first portions SP1b of the sensing patterns SP1 may be spaced apart from each other across the middle portion CP2 in the first direction DR1. The bridge pattern CP1 may electrically connect the sensing patterns SP1 spaced apart from each other. FIG. 10B illustrates two bridge patterns CP1 arranged in the sensing unit SU. However, the number of bridge patterns CP1 arranged in the sensing unit SU is not limited thereto, which may be less or more.

As shown in FIG. 10B, the bridge patterns CP1 may be in the shape of a bent line such as "A" or "v" on the plane. The bridge patterns CP1 in the shape of the bent line may overlap the sensing portions SP2. However, the present disclosure is not limited thereto. The bridge patterns CP1 may be in the shape of a straight line extending along the first direction DR1 and may overlap the middle portion CP2 on the plane.

Each of the dummy patterns DUP may be electrically floating patterns. Each of the dummy patterns DUP may be patterns insulated from the first sensing electrodes E1-1 to E1-6 and the second sensing electrodes E2-1 to E2-4. The dummy patterns DUP may include first to fourth dummy patterns DUP1 to DUP4 depending on an arrangement position.

The first dummy patterns DUP1 may be arranged between the first sensing electrodes E1-1 to E1-6 and the second sensing electrodes E2-1 to E2-4. In detail, the first dummy patterns DUP1 may be arranged between the sensing pattern SP1 and the sensing portions SP2. For example, as shown in FIG. 10B, the first dummy patterns DUP1 may be arranged between the second portions SP1a of the sensing pattern SP1 and the branch portions SP2c1 to SP2c4 of the sensing portions SP2 to surround the branch portions SP2c1 to SP2c4.

As the first dummy patterns DUP1 are arranged between the sensing patterns SP1 and the sensing portions SP2, mutual capacitance between the sensing patterns SP1 and the sensing portions SP2 may be reduced. However, although the first dummy patterns DUP1 are arranged, the amount of change in mutual capacitance by occurrence of a touch event may not be significantly reduced. Thus, an (amount of change in mutual capacitance)/(mutual capacitance) value may be increased by the first dummy patterns DUP1.

Thus, a ghost touch phenomenon which occurs in a specific environment by the first dummy patterns DUP1 may be reduced. The ghost touch phenomenon refers to a phenomenon where a noise signal rather than a signal actually generated by a touch event is amplified and recognized as a touch. For example, when a portion of the sensing area increases in temperature by an operation such as a touch event in a low-temperature state and when the entire sensing area is turned on, it may operate as if a touch occurs in an area in which a touch event did not occur in the sensing area. However, the ghost touch phenomenon may be reduced by the first dummy patterns DUP1, and reliability of the input sensor 200 may be improved.

An interval between the sensing patterns SP1 and the sensing portions SP2 may be increased by the first dummy patterns DUP1. A probability that the sensing patterns SP1 and the sensing portions SP2 will be short-circuited may be reduced. For example, an interval between the sensing patterns SP1 and the sensing portions SP2 may be a scale of about 4 μm to about 5 μm when the first dummy patterns DUP1 are not arranged, whereas an interval between the sensing patterns SP1 and the sensing portions SP2 may increase to a scale of about 70 μm or more when the first dummy patterns DUP1 are arranged. Thus, only when foreign substances or residues of about 70 μm or more should occur in an area where the first dummy patterns DUP1 are arranged, the sensing patterns SP1 and the sensing portions SP2 may be short-circuited.

The first dummy patterns DUP1 may include a plurality of patterns electrically insulated from each other. The plurality of patterns may vary in size with the sensing unit SU with regard to mutual capacitance and visibility. However, the embodiments of the first dummy patterns DUP1 are not limited thereto.

The second dummy patterns DUP2 may be surrounded by the second extension portion SP2b of the above-mentioned sensing portion SP2. The third dummy patterns DUP3 may be surrounded by the sensing pattern SP1. The fourth dummy patterns DUP4 may be arranged between the first sensing electrodes E1-1 to E1-6 arranged along the second direction DR2 in FIG. 10A. Meanwhile, according to some embodiments, at least some of the first to fourth dummy patterns DUP1 to DUP4 may be omitted.

Figure 11:
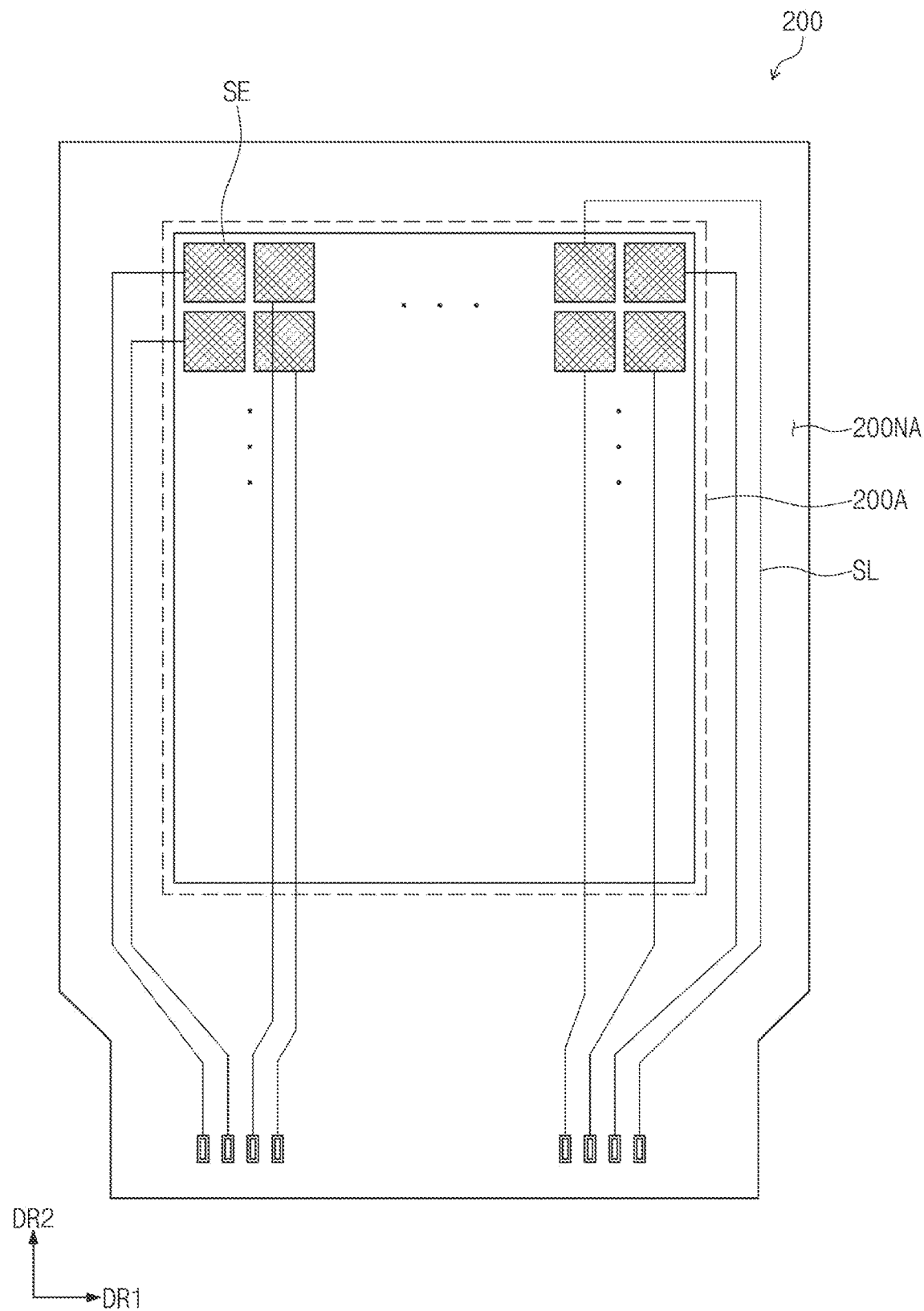
FIG. 11 is a plan view of an input sensor according to some embodiments of the present disclosure.

FIG. 11 is a plan view of an input sensor 200 according to some embodiments of the present disclosure. Referring to FIG. 11, an input sensor 200 including a single conductive layer driven in a self-cap manner is illustrated. The structure and the feature of the sensing electrode described with reference to FIGS. 8A to 9C are also applicable to the input sensor 200 described below, and the above-mentioned WAD reduction effect may also occur in the input sensor 200 described below.

The input sensor 200 may include a plurality of sensing electrodes SE and a plurality of signal lines SL. The sensing electrodes SE may have unique coordinate information. For example, the sensing electrodes SE may be arranged in the form of a matrix and may be connected with the signal lines SL, respectively.

According to the above, the wavelength shift of a white image may be reduced. The display quality of the display device may be improved.

While the present disclosure has been described with reference to some embodiments thereof, it will be apparent to those of ordinary skill in the art that various changes and modifications may be made thereto without departing from the spirit and scope of the present disclosure as set forth in the following claims. Accordingly, the technical scope of the present disclosure should not be limited to the contents described in the detailed description of the specification, but should be defined by the claims, and their equivalents.

What is claimed is:

1. A display device, comprising:
a display panel including first, second, and third color light emitting areas and a non-light emitting area arranged among the first, second, and third color light emitting areas; and
an input sensor on the display panel and including a sensing electrode, in which first, second, and third openings corresponding to the first, second, and third color light emitting areas are defined and overlapping the non-light emitting area,
wherein the sensing electrode includes a first line area and a second line area facing each other in a first direction around each of the first, second, and third openings and a third line area and a fourth line area facing each other in a second direction intersecting the first direction around each of the first, second, and third openings, and
wherein a distance across a separation space between the first color light emitting area and the first line area around the first opening is less than a distance across a separation space between the second color light emitting area and the first line area around the second opening, and
the distance across a separation space between the first color light emitting area and the first line area around the first opening is less than a distance across a separation space between the third color light emitting area and the first line area around the third opening.

2. The display device of claim 1, wherein a distance between the first color light emitting area and the third line area and a distance between the first color light emitting area and the fourth line area are the same as each other,
wherein a distance between the second color light emitting area and the third line area and a distance between the second color light emitting area and the fourth line area are the same as each other, and
wherein a distance between the third color light emitting area and the third line area and a distance between the third color light emitting area and the fourth line area are the same as each other.

3. The display device of claim 2, wherein a distance between the first color light emitting area and the second line area, a distance between the second color light emitting area and the second line area, and a distance between the third color light emitting area and the second line area are the same as one another.

4. The display device of claim 1, wherein the distance between the first color light emitting area and the first line area is less than a distance between the first color light emitting area and the second line area,
wherein the distance between the second color light emitting area and the first line area and a distance between the second color light emitting area and the second line area are the same as each other, and
wherein the distance between the third color light emitting area and the first line area and a distance between the third color light emitting area and the second line area are the same as each other.

5. The display device of claim 1, wherein the first line area and the second line area extend in the second direction,
wherein a line width of the first line area adjacent to the first color light emitting area is greater than a line width of the first line area adjacent to the second color light emitting area, and
the line width of the first line area adjacent to the first color light emitting area is greater than a line width of the third line area adjacent to the third color light emitting area.

6. The display device of claim 5, wherein the third line area and the fourth line area extend in the first direction,
wherein the line width of the first line area adjacent to the first color light emitting area is greater than a line width of the third line area adjacent to the first color light emitting area, and
the line width of the first line area adjacent to the first color light emitting area is greater than a line width of the fourth line area adjacent to the first color light emitting area.

7. The display device of claim 1, wherein each of the first, second, and third color light emitting areas includes a first edge and a second edge facing each other in the first direction and a third edge and a fourth edge facing each other in the second direction.

8. The display device of claim 1, wherein a spherical coordinate system is defined in the display panel,
wherein a white image displayed on the display panel is measured as a white image shifted to a first color at a first point of the spherical coordinate system, and
wherein the first point is more adjacent to the first line area than the second line area.

9. The display device of claim 1, wherein a distance between the first color light emitting area and the third line area is less than a distance between the second color light emitting area and the third line area and the distance between the first color light emitting area and the third line area is less than a distance between the third color light emitting area and the third line area.

10. The display device of claim 1, wherein a distance between one of the second color light emitting area and the third color light emitting area and one of the second to fourth areas is less than a distance between the other of the second color light emitting area and the third color light emitting area and the one of the second to fourth areas, and
wherein the distance between the one of the second color light emitting area and the third color light emitting area and the one of the second to fourth areas is less than a distance between the first color light emitting area and the one of the second to fourth areas.

11. The display device of claim 1, wherein the distance between the first color light emitting area and the first line area is 15 to 20 micrometers.

12. The display device of claim 1, further comprising:
an optical film on the input sensor,
wherein the optical film includes a polarizing film and a retarder film.

13. The display device of claim 1, wherein each of the first color light emitting area, the second color light emitting area, and the third color light emitting area is provided in plural,
wherein the plurality of first color light emitting areas and the plurality of third color light emitting areas define a first row,
wherein the plurality of second color light emitting areas define a second row, and wherein the plurality of first color light emitting areas and the plurality of third color light emitting areas are alternately arranged along a third direction intersecting the first direction and the second direction in the first row.

14. The display device of claim 1, wherein the display panel further includes a pixel definition layer in which first, second, and third color openings corresponding to the first, second, and third color light emitting areas are defined.

15. The display device of claim 1, wherein a thickness of the first line area adjacent to the first color light emitting area is greater than a thickness of the first line area adjacent to the second color light emitting area and the thickness of the first line area adjacent to the first color light emitting area is greater than a thickness of the first line area adjacent to the third color light emitting area.

16. A display device, comprising:
a display panel including first, second, and third color light emitting areas and a non-light emitting area arranged among the first, second, and third color light emitting areas; and
an input sensor on the display panel and including a sensing electrode in which first, second, and third openings corresponding to the first, second, and third color light emitting areas are defined,
wherein the sensing electrode includes a first conductive line overlapping the non-light emitting area and defining the first opening, a second conductive line defining the second opening, and a third conductive line defining the third opening,
wherein a distance across a separation space between a first area of the first conductive line adjacent to a first point (r1, θ1, φ1) of a spherical coordinate system and the first color light emitting area is less than a distance across a separation space between a second area of the first conductive line adjacent to a second point (r1, θ1, φ1+180°) of the spherical coordinate system and the first color light emitting area and the first color light emitting area is disposed between the first area of the first conductive line and the second area of the first conductive line,
wherein a distance across a separation space between a first area of the second conductive line adjacent to the first point (r1, θ1, φ1) and the second color light emitting area is the same as a distance across a separation space between a second area of the second conductive line adjacent to the second point (r1, θ1, φ1+180°) and the second color light emitting area and the second color light emitting area is disposed between the first area of the second conductive line and the second area of the second conductive line, and
wherein a distance across a separation space between a first area of the third conductive line adjacent to the first point (r1, θ1, φ1) and the third color light emitting area is the same as a distance across a separation space between a second area of the third conductive line adjacent to the second point (r1, θ1, φ1+180°) and the third color light emitting area and the third color light emitting area is disposed between the first area of the third conductive line and the second area of the third conductive line.

17. The display device of claim 16, wherein the first conductive line further includes a third area adjacent to a third point (r1, θ1, φ1−90°) of the spherical coordinate system and a fourth area adjacent to a fourth point (r1, θ1, φ1+90°) of the spherical coordinate system,
wherein the third area of the first conductive line and the fourth area of the first conductive line are arranged between the first area of the first conductive line and the second area of the first conductive line, and
wherein a distance between a third area of the first conductive line and the first color light emitting area is the same as a distance between a fourth area of the first conductive line and the first color light emitting area.

18. The display device of claim 17, wherein the distance between the first area of the first conductive line and the first color light emitting area is the same as a distance between the third area of the first conductive line and the first color light emitting area.

19. The display device of claim 16, wherein the first area of the first conductive line has a wider line width than the second area of the first conductive line.

20. The display device of claim 17, wherein each of the first area of the first conductive line and the second area of the first conductive line is parallel to a virtual line connecting the third point (r1, θ1, φ1−90°) and the fourth point (r1, θ1, φ1+90°).

* * * * *